United States Patent
Dovids et al.

(10) Patent No.: US 10,515,835 B2
(45) Date of Patent: Dec. 24, 2019

(54) HIGH DENSITY TEC-CELL CARRIER

(71) Applicant: MURATA MACHINERY, LTD., Kyoto-shi, Kyoto (JP)

(72) Inventors: Gerhard Dovids, Grabs (CH); Yves Fenner, Berg (CH); John Fiddes, Kreuzlingen (CH); Christian Wohanka, Tägerwilen (CH); Bernd Rahrbach, Constance (DE)

(73) Assignee: MURATA MACHINERY, LTD., Kyoto (JP)

( * ) Notice: Subject to any disclaimer, the term of this patent is extended or adjusted under 35 U.S.C. 154(b) by 165 days.

(21) Appl. No.: 15/791,599

(22) Filed: Oct. 24, 2017

(65) Prior Publication Data

US 2018/0122674 A1    May 3, 2018

Related U.S. Application Data

(60) Provisional application No. 62/412,245, filed on Oct. 24, 2016.

(51) Int. Cl.
*H01L 21/677* (2006.01)
*H01L 21/673* (2006.01)
*B25J 11/00* (2006.01)

(52) U.S. Cl.
CPC ...... *H01L 21/67769* (2013.01); *B25J 11/0095* (2013.01); *H01L 21/67346* (2013.01); *H01L 21/67383* (2013.01); *H01L 21/67389* (2013.01); *H01L 21/67742* (2013.01); *H01L 21/67778* (2013.01)

(58) Field of Classification Search
CPC ......... H01L 21/67769; H01L 21/67346; H01L 21/67383; H01L 21/67778
See application file for complete search history.

(56) References Cited

U.S. PATENT DOCUMENTS

| 2018/0122674 A1* | 5/2018 | Dovids | H01L 21/67386 |
| 2018/0122675 A1* | 5/2018 | Dovids | H01L 21/67766 |

FOREIGN PATENT DOCUMENTS

JP         2009260252 A   * 11/2009

* cited by examiner

*Primary Examiner* — Gerald McClain
(74) *Attorney, Agent, or Firm* — Keating & Bennett, LLP

(57) ABSTRACT

The invention disclosed relates generally to handling substrates and wafers. In an example embodiment, to an improved wafer and substrate carrier or carrier system, method or apparatus. More specifically, to a carrier with improved abilities which may provide high density carriers, improved efficiency and other abilities such as increased cleanliness and reduced contamination to wafers during handling, storage or processing as well as higher density storage and better stocking, storage and handling abilities.

15 Claims, 25 Drawing Sheets

Forming a carrier, wherein the carrier is configured to support a substrate, wherein the carrier is configured to be picked up by a robot
200

FIG. 2A

Picking one or more carriers, by a robot, wherein each carrier is configured to support a substrate
220

FIG. 2B

Picking a substrate, by a robot, wherein the substrate is disposed on a carrier, wherein the carrier is configured to by picked up by another robot
240

FIG. 2C

FIG. 3A
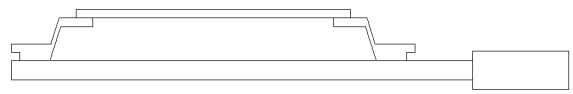
FIG. 3B
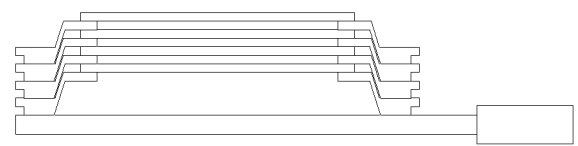
FIG. 3C
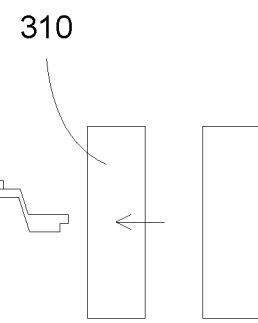
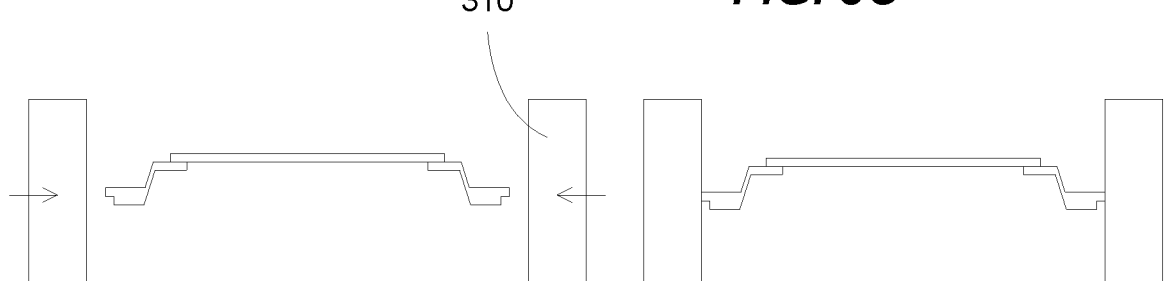
FIG. 3D  FIG. 3E
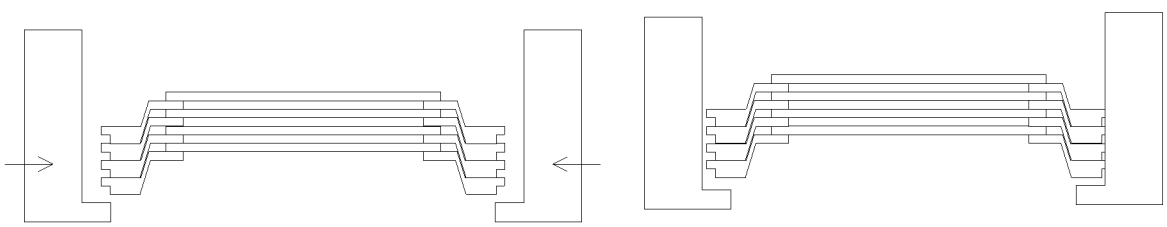
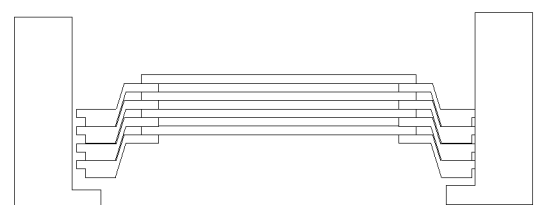
FIG. 3F  FIG. 3G Stacking carriers to form a stack of carriers, wherein each carrier is configured to support a substrate, wherein each carrier and the stack of carriers are configured to be picked up by a robot
400

*FIG. 4A*

Forming a robot, wherein the robot is configured to handle a carrier or a stack of carriers, wherein each carrier is configured to support a substrate
420

*FIG. 4B*

Forming a carrier, wherein the carrier is configured to support a substrate, wherein the carrier is configured to be stackable with another carrier for a substrate spacing of less than 5, 4, 3, 2 ,or 1 mm
440

*FIG. 4C*

Installing at least one of a sensor and a communication module on a carrier, wherein the carrier is configured to support a substrate
600

FIG. 6A

Forming at least an electrical connector on a carrier, wherein the electrical connector is configured to form an electrical connection with another electrical connector of another carrier, wherein each carrier is configured to support a substrate
620

FIG. 6B

Forming at least an electrical connector on a robot, wherein the electrical connector is configured to form an electrical connection with another electrical connector on a carrier, wherein the carrier is configured to support a substrate
640

FIG. 6C

Picking a carrier by a robot, wherein the carrier comprises a first electrical connector, wherein the robot comprises a second electrical connector, wherein the first and second electrical connectors are configured to form an electrical connection when the robot picks up the carrier
660

FIG. 6D

Forming a protective element on a carrier, wherein the carrier is configured to support a substrate
800

*FIG. 8A*

Forming a membrane on a first carrier, wherein the first carrier is configured to be stackable with a second carrier, wherein the second carrier is configured to support a substrate
820

*FIG. 8B*

Forming a purge channel on a carrier, wherein the carrier is configured to support a substrate, wherein the purge channel is configured to provide a purge gas to the substrate
1000

FIG. 10A

Forming a purge connection on a carrier, wherein the carrier is configured to support a substrate, wherein the purge connection is configured to be coupled with other purge connections of other carriers to provide a purge gas to the substrate
1020

FIG. 10B

Forming a purge connection on a robot, wherein the purge connection is configured to couple with another purge connection on a carrier, wherein the carrier is configured to support a substrate, wherein the purge connection is configured to provide a purge gas to the substrate
1040

FIG. 10C

FIG. 11A
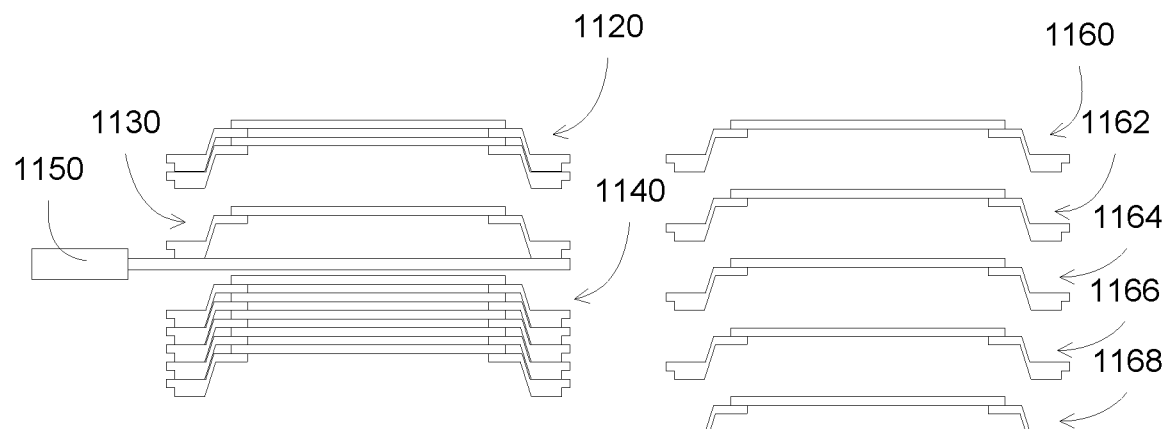
FIG. 11B
FIG. 11D
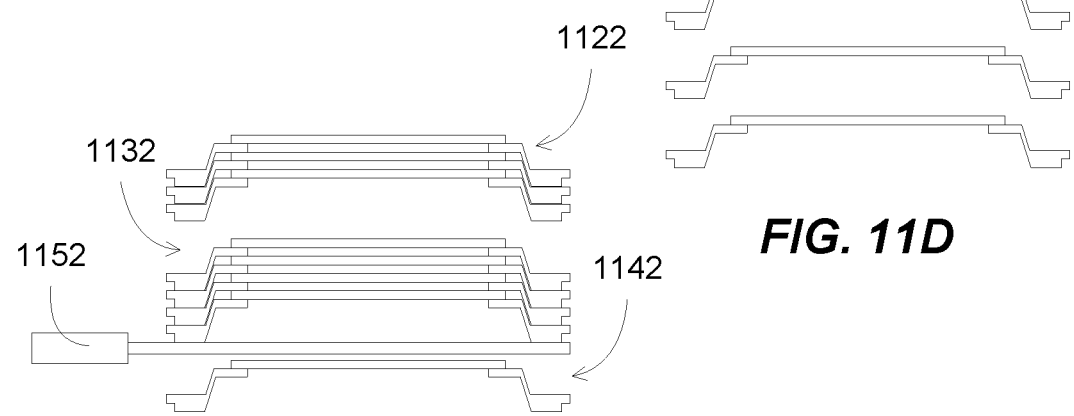
FIG. 11C

```
┌─────────────────────────────────────────────────────┐
│ Separating a spacing between carriers to allow one │
│               or more carriers to be picked up       │
│                         1400                         │
└─────────────────────────────────────────────────────┘
```

FIG. 14A

```
┌─────────────────────────────────────────────────────┐
│ Identifying first carriers to be picked up in a     │
│                    stack of carriers                 │
│                         1420                         │
└─────────────────────────────────────────────────────┘
                          ↓
┌─────────────────────────────────────────────────────┐
│ Separating second carriers from the first carriers,│
│ wherein the second carriers are disposed above or   │
│           below the first carriers in the stack      │
│                         1430                         │
└─────────────────────────────────────────────────────┘
                          ↓
┌─────────────────────────────────────────────────────┐
│         Removing the first carriers from the stack  │
│                         1440                         │
└─────────────────────────────────────────────────────┘
```

FIG. 14B

```
┌─────────────────────────────────────────────────────┐
│ Increasing all spacing between carriers in a stack  │
│                      of carriers                     │
│                         1460                         │
└─────────────────────────────────────────────────────┘
                          ↓
┌─────────────────────────────────────────────────────┐
│      Sequentially removing the carriers from the stack │
│                         1470                         │
└─────────────────────────────────────────────────────┘
```

FIG. 14C

```
┌─────────────────────────────────────────────────────┐
│ Transferring a stack of substrates, wherein the     │
│ substrates comprise a first pitch                   │
│                    1500                             │
└─────────────────────────────────────────────────────┘
                          │
                          ▼
┌─────────────────────────────────────────────────────┐
│ Separating the stack of substrates so that the      │
│ substrates comprises a second pitch larger than     │
│ the first pitch                                     │
│                    1510                             │
└─────────────────────────────────────────────────────┘
                          │
                          ▼
┌─────────────────────────────────────────────────────┐
│ Transferring individual substrates at the second    │
│ pitch                                               │
│                    1520                             │
└─────────────────────────────────────────────────────┘
```

*FIG. 15A*

```
┌─────────────────────────────────────────────────────┐
│ Transferring individual substrates to form a stack  │
│ of substrates, wherein the substrates comprise a    │
│ first pitch                                         │
│                    1540                             │
└─────────────────────────────────────────────────────┘
                          │
                          ▼
┌─────────────────────────────────────────────────────┐
│ Collapsing the stack of substrates so that the      │
│ substrates comprises a second pitch smaller than    │
│ the first pitch                                     │
│                    1550                             │
└─────────────────────────────────────────────────────┘
                          │
                          ▼
┌─────────────────────────────────────────────────────┐
│ Transferring the stack of substrates                │
│                    1560                             │
└─────────────────────────────────────────────────────┘
```

*FIG. 15B*

Forming a robot, wherein the robot comprises a first handler for handling carriers and a second handler for handling substrates
2100

FIG. 21A

Picking one or more carriers by a first handler of a robot
2120

Picking a substrate by a second handler of the robot
2130

FIG. 21B

Picking a carrier by a first handler of a robot
2150

Picking a substrate on the carrier by a second handler of the robot
2160

FIG. 21C

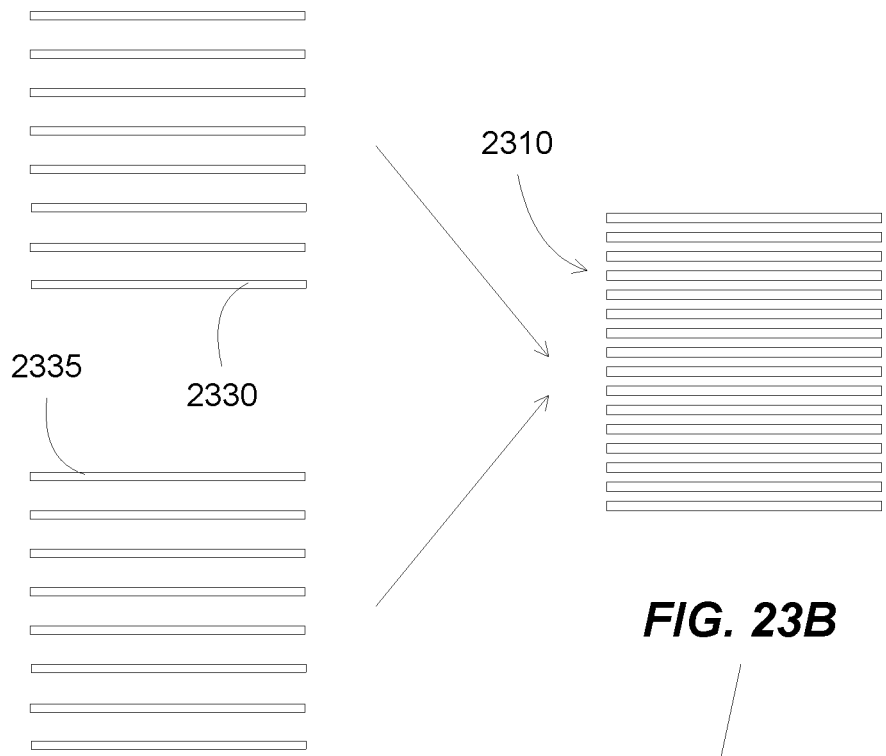
FIG. 23A
FIG. 23B
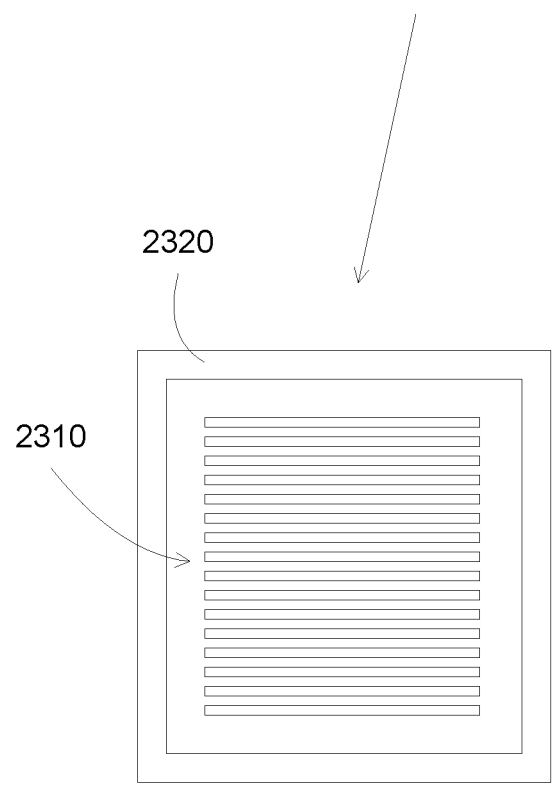
FIG. 23C

Storing a stack of carriers in a container, wherein the carriers are configured to support substrates
2500

FIG. 25A

Consolidating two or more sets of substrates to form a stack of substrates, wherein the stack of substrates comprises a smaller spacing than a spacing of the sets of substrates
2520

↓

Storing the stack of substrates in a container
2530

FIG. 25B

Forming a stack of carriers or substrates
2550

↓

Placing the stack in a container
2560

↓

Transferring or storing the container
2570

FIG. 25C

HIGH DENSITY TEC-CELL CARRIER

This application claims priority from at least U.S. Provisional Patent Application 62/412,245 filed on Oct. 24, 2016 and U.S. Provisional Patent Application 62/355,856 filed on Jun. 28, 2016 and entitled "Substrate Storage and Processing" which applications may be incorporated herein by reference in its entirety for all purposes.

FIELD OF TECHNOLOGY

This disclosure relates generally to handling substrates and wafers. In one example embodiment, to an improved wafer and substrate carrier or carrier system, method or apparatus. More specifically, to a carrier with improved abilities which may provide high density carriers, improved efficiency and other abilities.

BACKGROUND

Within many fields substrates and wafers must be processed, stored and otherwise moved within a factory, assembly line, or system. Since the introduction of the 300 mm wafer semiconductor material, Front Opening Unified Pods, or "FOUPs," have become the standard storage and transport method of substrates and similar materials. FOUPs have been used to isolate and hold silicon wafers for use in semiconductor production. Semiconductors, fundamental in the design of digital circuitry, microprocessors, and transistors, require these wafers to remain in as close to immaculate condition as storage units allow. Accordingly, FOUPs allow wafers to be transferred between other machines used in the processing and measurement of wafers.

Prior FOUPs generally serve to preserve wafers from the surrounding clean room environment. In conventional semiconductor projects, FOUPs allow wafers to enter the apparatus via a load port and front opening door. Often, robot handling mechanisms may place the wafers into the FOUP, where they may be clamped in place by fins and held for later use. Yet FOUPs today may be hampered by methods and system designs which may contaminate their contents, chafe wafers, and delay loading and unloading of substrate wafer contents as a result of multifarious construction. Thus, there may be a need for an invention that more efficiently and accurately accomplishes the desired tasks of FOUPs.

Additionally, FOUPs may be hampered by their design in that they cannot hold wafers at a reasonably high density. Manufacturing and processing require that wafers and substrates be provided in high numbers, through small areas and footprints to many locations or aspects in a system. With higher density carriers, faster and more efficient production can be made. Additionally, FOUPs lack many features aiding in cleanliness, efficiency and contamination reduction, as well as other aspects, and do not provide for space saving or high density holding or carrying of wafers and substrates. As such FOUPs then may be inefficient and unable to provide for the needs of today's substrate and wafer manufacturing and processing.

Issues with prior substrate storage devices may be exacerbated with construction sizes of typical FOUPs, which may be produced in multiple stages of multiple parts, typically holding a maximum of 25 wafer jobs of 300 mm wafer fibs and device heights of upwards of 330 mm. Recalling that high volume shipments may be imperative, the size of these FOUPs hamper scaling efforts and diminish efficiency by requiring the construction of the storage FOUPs in steps and parts, especially if smaller sized containers may be created to contain the same volume of substrate. Thus, a substrate storage device which streamlines construction processes may increase efficiency of creation, storage and ease of replication in the manufacturing process.

Therefore, an improved carrier may be needed which provides substrate or wafers with contamination reduction, improved transportation and efficiency, as well as other features in semiconductor manufacturing or like processes. These improved carriers may have aspects necessary for clean efficient processing, storage or manufacturing. Also, a need exists for simultaneously providing higher density wafer and substrate carrying as well as an ability to access high density carriers and storages efficiently and quickly, including improvements such as tracking, identification etc. as well as being able to be implemented in existing FOUP systems and other systems.

SUMMARY

Disclosed may be methods, apparatus, and systems that provide an improved wafer and substrate carrier or carrier system, method or apparatus. More specifically, to a carrier with improved abilities which may provide high density carriers, improved efficiency and other abilities.

The present invention may provide a carrier, which may be an improved carrier for wafers and substrates over prior Tec-Cell and FOUP standard designs and other Prior Arts. The carrier described may hold a wafer or substrate and be able to provide carrier abilities wherein a single carrier holds a single substrate.

The present invention carriers in some embodiments may be stacked or otherwise key into each other into stacks or vertical formations. It may be imagined in some very limited embodiments, they may be stacked horizontally as well. When the carriers, with wafers or substrates, may be stacked, they may key into each other such that the wafer or substrate does not touch the adjacent carrier or wafer or substrate, but that the formation provides for space saving and high density design. In addition within each carrier, on any side of the carrier, substrate or wafer may be a membrane which may isolate each carrier, substrate or wafer from adjacent ones, such as to prevent contamination if one wafer, carrier or substrate may be contaminated or breaks etc.

Each carrier may internally to the carrier structure such as a cavity may provide where a purge gas may be introduced to a side, bottom or top carrier, and the purge gas may travel internally through the carrier structure to be introduced to the wafer in a laminar fashion. Also the carriers may be structured such that a passage or cavity may exist to transfer the purge gas from one carrier to the next such that all the carriers, or some of the carriers may receive purge gas to purge their wafer or substrate in a laminar fashion. Additionally, each carrier may include power connections, electrical connections, data connections, etc. of which may connect between carrier to carrier, or form carrier to a larger system wither wirelessly, by contact or another fashion. This can include also robots and other handling means having abilities to do so. In addition this may be accomplished by RFID.

The carriers when stacked or individual may be then placed in compartments of which may include OHT abilities as well as provide for a high density and clean storage or container or compartment. These compartments may be fed by robot.

The aforementioned and later mentioned robots may be able to move the carriers from one area, position or location to another either individually or as a stack. The robots may include multiple effectors, where each robot may include at least a wafer effector, which provides for being able to unload or move the wafer, and a carrier effector which may include or carry the carrier with or without the wafer.

In addition, there may be sorting systems and stations with robots that may take wafers form one stack or multiple stacks and reorganize them, or stack them, or otherwise sort them, either stack to stack, sub stack to subs stack, individually or any combination or permeations. This may also be done when unloading other carriers, such as FOUPs or reloading, as well as the present invention Tec-Cell carriers and old designs.

A station may also exist wherein a robot may transfer the carriers and wafer from high density position to a lower density position, or to at least be able to have a robot access the wafers and carriers. When the wafers and carriers may be stacked it may be difficult or impossible for a robot or other mechanisms to access the wafers or carriers, and thus a system may be included wherein the wafers and carriers may be opened such that a robot or other mechanism may move or otherwise move or access the carriers and wafers. The opener station may also close the stack such that the stack may be put back in high density formation.

Thus, the present invention provides a high density efficient substrate carrier system or method which may provide susurrate and wafer manufacturing needs with high efficiency and abilities.

The methods and systems disclosed herein may be implemented in any means for achieving various aspects. Other features will be apparent from the accompanying drawings and from the detailed description that follows.

BRIEF DESCRIPTION OF THE DRAWINGS

Example embodiments may be illustrated by way of example and may be not limited to the figures of the accompanying drawings, in which, like references indicate similar elements.

FIGS. 2A, 2B and 2C may be flow charts of an embodiment of the present invention Tec-Cell.

FIGS. 3A, 3B, 3C, 3D, 3E, 3F and 3G may be profile views of an embodiment of the present invention Tec-Cell.

FIGS. 4A, 4B and 4C may be flow charts of an embodiment of the present invention Tec-Cell.

FIGS. 6A, 6B, 6C and 6D may be flow charts of an embodiment of the present invention Tec-Cell.

FIGS. 8A and 8B may be flow charts of an embodiment of the present invention Tec-Cell.

FIGS. 10A, 10B and 10C may be flow charts of an embodiment of the present invention Tec-Cell.

FIGS. 11A, 11B, 11C and 11D may be profile views of an embodiment of the present invention Tec-Cell.

FIGS. 14A, 14B and 14C may be flow charts of an embodiment of the present invention Tec-Cell.

FIGS. 15A and 15B may be flow charts of an embodiment of the present invention Tec-Cell.

FIGS. 21A, 21B and 21C may be flow charts of an embodiment of the present invention Tec-Cell.

FIGS. 23A, 23B and 23C may be profile views of an embodiment of the present invention Tec-Cell.

FIGS. 25A, 25B and 25C may be flow charts of an embodiment of the present invention Tec-Cell.

Figure 1A:
FIGS. 1A, 1B, 1C 1D, 1E and 1F may be profile views of an embodiment of the present invention Tec-Cell.

Other features of the present embodiments will be apparent from the accompanying drawings and from the detailed description that follows.

DETAILED DESCRIPTION

Disclosed may be methods, apparatus, and systems that may provide for an improved substrate or wafer carrier with high density features.

In an embodiment, of which may be combined with any other embodiment, the present invention may provide for a wafer or substrate carrier of which may be called a Tec-Cell which may provide for higher wafer carrying ability or density than FOUPs.

In an embodiment, of which may be combined with any other embodiment, the present invention may provide for a wafer or substrate carrier which may provide for batch transfer and single wafer transfer methods and systems for new Tec-Cell.

In an embodiment, of which may be combined with any other embodiment, the present invention may provide for a wafer or substrate carrier and of which may provide for an opener station and methods for the present invention new Tec-Cell. This may be wherein the opener station may allow the Tec-Cell in high density position to be put into an opened position.

In an embodiment, of which may be combined with any other embodiment, the present invention may provide for an opener station for stocker using old Tec-Cells, as well as any other wafer or substrate carrier types whether proprietary or third party.

In an embodiment, of which may be combined with any other embodiment, the present invention may provide for sorter stations which may provide for sorting and reorganization or position of the improved present invention Tec-Cell, older Tec-Cell designs and any other substrate carriers, such as FOUPs.

In an embodiment, of which may be combined with any other embodiment, the present invention may provide a purge ability In an embodiment, of which may be combined with any other embodiment, the present invention may provide for each individual carrier to have a design and structure which avoids 180 degree rotation between 2 adjacent carriers.

In an embodiment, of which may be combined with any other embodiment, the present invention may provide protection for all wafers from breakage contamination. This may include a membrane between each carrier and wafer.

In an embodiment, of which may be combined with any other embodiment, the present invention may provide for handling the carriers individually with a robot instead of prior designs wherein the wafer itself may be handled by a robot.

In an embodiment, of which may be combined with any other embodiment, the present invention may provide handling individual carriers, or a group of carriers.

In an embodiment, of which may be combined with any other embodiment, the present invention may provide wherein the wafer surface can be purged during the robot handling or transport or sorting.

In an embodiment, of which may be combined with any other embodiment, the present invention may provide wherein the carriers may be electrically interconnected to each other including power and data.

In an embodiment, of which may be combined with any other embodiment, the present invention may provide an improved carrier for wafers and substrates over prior Tec-Cell and FOUP standard designs and other Prior Arts wherein the carrier described may hold a wafer or substrate and be able to provide carrier abilities wherein a single carrier holds a single substrate.

In an embodiment, of which may be combined with any other embodiment, the present invention may provide carriers, with wafers or substrates, may be stacked, they may key into each other such that the wafer or substrate does not touch the adjacent carrier or wafer or substrate, but that the formation provides for space saving and high density design.

In an embodiment, of which may be combined with any other embodiment, the present invention may provide wherein within each carrier, on any side of the carrier, substrate or wafer may be a membrane which may isolate each carrier, substrate or wafer from adjacent ones, such as to prevent contamination if one wafer, carrier or substrate may be contaminated or breaks etc.

In an embodiment, of which may be combined with any other embodiment, the present invention may provide a cavity within each carrier may provide where a purge gas may be introduced to a side, bottom or top carrier, and the purge gas may travel internally through the carrier structure to be introduced to the wafer in a laminar fashion. Also the carriers may be structured such that a passage or cavity may exist to transfer the purge gas from one carrier to the next such that all the carriers, or some of the carriers may receive purge gas to purge their wafer or substrate in a laminar fashion.

In an embodiment, of which may be combined with any other embodiment, the present invention may provide power connections, electrical connections, data connections, etc. of which may connect between carrier to carrier, or form carrier to a larger system wither wirelessly, by contact or another fashion. This can include also robots and other handling means having abilities to do so. In addition this may be accomplished by RFID.

In an embodiment, of which may be combined with any other embodiment, the present invention may provide carriers when stacked or individual may be then placed in compartments of which may include OHT abilities as well as provide for a high density and clean storage or container or compartment. These compartments may be fed by robot.

In an embodiment, of which may be combined with any other embodiment, the present invention may provide robots may be able to move the carriers from one area, position or location to another either individually or as a stack. The robots may include multiple effectors, where each robot may include at least a wafer effector, which provides for being able to unload or move the wafer, and a carrier effector which may include or carry the carrier with or without the wafer.

In an embodiment, of which may be combined with any other embodiment, the present invention may provide a sorting systems and stations with robots that may take wafers form one stack or multiple stacks and reorganize them, or stack them, or otherwise sort them, either stack to stack, sub stack to subs stack, individually or any combination or permeations. This may also be done when unloading other carriers, such as FOUPs or reloading, as well as the present invention Tec-Cell carriers and old designs.

In an embodiment, of which may be combined with any other embodiment, the present invention may provide A station wherein a robot may transfer the carriers and wafer from high density position to a lower density position, or to at least be able to have a robot access the wafers and carriers. When the wafers and carriers may be stacked it may be difficult or impossible for a robot or other mechanisms to access the wafers or carriers, and thus a system may be included wherein the wafers and carriers may be opened such that a robot or other mechanism may move or otherwise move or access the carriers and wafers. The opener station may also close the stack such that the stack may be put back in high density formation.

In an embodiment, of which may be combined with any other embodiment, the present invention may provide ESD protection, e.g., ESD grounding in the carriers.

In an embodiment, of which may be combined with any other embodiment, the present invention may provide one material or multiple materials, such as PEEK with coated with a SEMI approved material, or the top portion of the carrier can be an embedded material like the prior Tec-Cell designs.

In an embodiment, of which may be combined with any other embodiment, the present invention may provide power to each carrier, such as induced power (wireless power), rechargeable battery, or physical connectors so that power can be supplied by the robot. The power source can be from the robot or from the carriers.

In an embodiment, of which may be combined with any other embodiment, the present invention may provide communication in each carrier, for ID reading, wafer presence, wafer breakage, reporting of all sensors in carriers In an embodiment, of which may be combined with any other embodiment, the present invention may provide sensors for ESD, chemical outgassing, wafer presence, wafer breakage, etc.

In an embodiment, of which may be combined with any other embodiment, the present invention may provide the carriers may be configured to be handled by a robot, with optional power connectors for connecting to each other. Sensors for knowing the carriers (such as RFID on the carriers) and knowing wafers.

In an embodiment, of which may be combined with any other embodiment, the present invention may provide batch transfer and single wafer transfer methods and systems for the present invention Tech-Cell.

In an embodiment, of which may be combined with any other embodiment, the present invention may provide the carriers can be configured to be transferred singularly or in stack, e.g., one carrier or multiple carriers can be transferred by a robot at a time.

In an embodiment, of which may be combined with any other embodiment, the present invention may provide opener stations can be used to separate the carriers for transferring.

In an embodiment, of which may be combined with any other embodiment, the present invention may provide wherein when transfer a whole stack, opener station may be not needed. To transfer one or more carriers in a stack, then the carriers above and the carriers below of the one or more carriers will need to be separated, to allow the one or more carriers to move without interfering with the remainder of the stack.

In an embodiment, of which may be combined with any other embodiment, the present invention may provide wherein the present invention Tec-Cell carriers may be closely packed, with separation pitch may be in order on mm (1-5 mm). The opener can separate the carriers, for example to 10 mm, which may be semi standard for the carriers to be handled by a robot.

In an embodiment, of which may be combined with any other embodiment, the present invention may provide the opener can separate all carriers in a stack of the present invention Tec-Cell carriers, so that all carriers can be individually handled by a robot.

In an embodiment, of which may be combined with any other embodiment, the present invention may provide the opener can separate the carriers so that one carrier may be exposed, meaning the carriers above and the carriers below the exposed carrier may be opened. The exposed carrier can be handled by a robot.

In an embodiment, of which may be combined with any other embodiment, the present invention may provide the opener can separate the carriers so that more than one carriers may be exposed, meaning the carriers above and the carriers below the exposed carriers may be opened. The multiple exposed carriers can be handled by a robot.

In an embodiment, of which may be combined with any other embodiment, the present invention may provide all carriers in a stack of the present invention Tec-cell carriers can be handled together by a robot, e.g., in a batch process, without using the opener station.

In an embodiment, of which may be combined with any other embodiment, the present invention may provide an Opener station for stocker using old Tec-cell or wafer carrier designs In an embodiment, of which may be combined with any other embodiment, the present invention may provide all or some wafers can be separated or collapsed.

In an embodiment, of which may be combined with any other embodiment, the present invention may provide the wafer carriers may be closely packed, with separation pitch may be in order on mm (1-5 mm). The opener can separate the carriers, for example to 10 mm, which may be semi standard for the wafers to be handled by a robot.

In an embodiment, of which may be combined with any other embodiment, the present invention may provide the opener can separate all carriers in a stack of wafers, so that all wafers can be individually handled by a robot.

In an embodiment, of which may be combined with any other embodiment, the present invention may provide the opener can separate the carriers so that one wafers may be exposed, meaning the carriers above and the carriers below the exposed wafers may be opened. The exposed wafers can be handled by a robot.

In an embodiment, of which may be combined with any other embodiment, the present invention may provide all carriers in a stack of carriers can be handled together by a robot.

In an embodiment, of which may be combined with any other embodiment, the present invention may provide wherein the carriers may be linked to present invention carrier.

In an embodiment, of which may be combined with any other embodiment, the present invention may provide sorter stations and methods using the new Tec-Cell.

In an embodiment, of which may be combined with any other embodiment, the present invention may provide the carriers can be moved, a stack of carriers can be sorted within itself, e.g., without the need for an intermediate station. For example, to move carrier #6 to location #3 in a 25 carrier stack, an opener can separate the carrier #6, e.g., lifting up the carriers #1-#5 and lowering down the carriers #7-#25. A robot can pick up the carrier #6 (with the wafer supported by the carrier) and withdraw from the stack. The stack can collapse, e.g., lowering the carriers #1-#5 and raising up the carriers #7-#25. Thus the stack may be now 24 carriers, e.g., without the carrier #6, since the carrier #6 may be at the robot. The stack can re-open with the location #3 exposed, e.g., lifting up the carriers #1-#2 and lowering down the carriers #3-#24 (location #6 now has carrier #7, and so on, since the carrier #6 has been out of the stack). The robot can insert the carrier #6 to the exposed location, making the carrier #6 placed at location #3, effectively sorting the carrier #6 to become carrier #3.

In an embodiment, of which may be combined with any other embodiment, the present invention may provide a sorting process can be performed on a number of carriers. For example, carriers #6-#8 can be sorted to locations #3-#5. The process may be similar, with 3 carriers moved together by the robot.

In an embodiment, of which may be combined with any other embodiment, the present invention may provide sorter stations using old carrier designs in conjunction with the present invention carrier.

In an embodiment, of which may be combined with any other embodiment, the present invention may provide the sorter use prior carrier designs such as could require 2 stations, such as a FOUP and an opener, or two openers (one with wafers and one empty) then wherein a special sorter can be used, have double the wafer capability. For example, the sorter station can have 25 slots for opener, and an extender for attach a stack of 25 more wafers. For example, empty 25 slots may be in collapse state. A stack of 25 wafers, in collapse state, can be added to the empty 25 slots. The 50 wafer stack can be open, and wafer from bottom 25 slots can be move to the top 25 slots, while being sorted.

In an embodiment, of which may be combined with any other embodiment, the present invention may provide in addition a combination of Zero Footprint solution (ceiling, above floor or sub-floor) for an improved wafer storage solution, metrology, wafer processing, high density Tec-Cell storage, protection by N2/CDA/other gases in confined environment, including stack ability, modularity, floor and ceiling mount architecture, storage in Tec-Cell, transfer module, not requiring clean room environment, better packaging, ESD wafer optimized (Ionization), Transfer Module.

The present invention may provide moving wafers from FOUPS to Tec-Cells (Zoom Pods) of which may include robot and other systems opener pitch can adapt to multi wafer end effectors, Stack alignment and read.

In an embodiment, of which may be combined with any other embodiment, the present invention may provide wherein the carrier Becomes/replaces robot end-effector.

In an embodiment, of which may be combined with any other embodiment, the present invention may provide a carrier wherein less space required and a higher density of wafers per space may be used.

It may be noted that any piece of the system, method or apparatus in particular embodiments may be absent or not present, in that some embodiments do not require the use of a particular aspect, or if the aspect may be broken down, the system may skip or use another method for resilient operation.

In an embodiment, which may be combined with any other embodiment, the present invention may provide for an EFEM for FOUPs and Tec-Cell carriers of which may link the present stocker and other processing stations. This EFEM may accept FOUPs and Tec-cell carriers with the opener as an option.

In an embodiment, which may be combined with any other embodiment, the present invention may provide any method, system or apparatus of transfer mechanism for the FOUPs, Tec-Cell carriers or substrates of which may include Zero Footprint solution, such as ceiling, above floor or sub-floor conveyors, robots or arms.

In an embodiment, which may be combined with any other embodiment, the present invention may provide any method to provide for high density storage, of which may include features such as protection by N2/XCDA and other gases in confined environment, stack ability for space constraints and density, modularity, and floor and ceiling mounts and mounting systems including transporters. In addition, the architecture of the system may include at least a storage in Tec-Cell and Transfer module, among other modules and features which allow for not requiring a clean room environment. In an embodiment, this may include better packaging and ESD wafer optimized (Ionization) for further quality control as well as improved seal and transfer systems and methods.

In an embodiment, which may be combined with any other embodiment, the present invention may provide Transfer Module which provide for moving wafers from FOUPS to Tec-Cells (Zoom Pods) manually or automatically, and may provide for the ability to have different or adjustable, either manually or automatically, opener design, pitch and ability of which may adapt to multi wafer end effectors. In addition, the stocks and towers may be automatically or manually, of which may align the stocks, and read the alignment well as stacks, both for proper placement, organization, sorting etc.

In some embodiments the Tec-Cell design may provide for particle and contaminant free storage, transportation and processing of substrates, and may include the ability to use process gasses or gases, such as to purge, clean or otherwise ensure a clean environment. The new invention Tec-Cell may include within the design a propriety ability to become or replace robot end-effectors, minimizing the space needed.

In an embodiment, which may be combined with any other embodiment, the present invention may provide Laminar flow in Tec-Cell to substrates individually or as a group and my include purge gas temperature control, purge time/before, during, after closing; recovery times; high flow/low flow.

In an embodiment, which may be combined with any other embodiment, the present invention may provide any new lighter materials such as Nano-tube material in any usage or structures. In some embodiment, the materials used may also include Peak coated material.

In an embodiment, which may be combined with any other embodiment, the present invention may include a aforementioned Tec-Cell stack "Zoom" module which may provide for Wafer density increase for storage, Wafer density increase for transportation in fab, Reduced footprint, Shortened wait time for wafer and improved efficiency of transfer, production and processing, increase transportation system throughput, allowing single and multi-wafer delivery or any plurality, configurable to include XCDA Gas purifiers, N2, NO or any other gas purge by Tec-Sell stack.

In an embodiment, which may be combined with any other embodiment, the present invention may provide any method where in the Tec-Cell stack, individual modules, or individual substrates may include includes electronic tracking device that detects, stores, communicates e.g.: humidity, temp, shock, charge, stack ID and may present information in any method or device wired or wirelessly or optical based, such as via IR, RFID, photo based such as barcode or QR code, wired, or any other method.

In an embodiment, which may be combined with any other embodiment, the present invention may provide a Tec-Cell opener which may include open single/multiple slots at the same time, Mover opener/move cell, robot or other device opening Tec-Cell.

In an embodiment, which may be combined with any other embodiment, the present invention may provide any an improved SSCMS Stocker Management system such that the Stocker management system works with MES (manufacturing execution) and Material Tracking system as well as other exterior or internal systems and software be of which may be $3^{rd}$ party, proprietary etc. It may be also noted that the software be may communicate and network with any existing device, of local intranet or the internet.

In an embodiment, which may be combined with any other embodiment, the present invention may provide an improved Transport vehicle which may provide Tec-Cell individual and multi wafer delivery.

In an embodiment, which may be combined with any other embodiment, the present invention may provide ionization and de-ionization depending on the application and substrates or objects being held. This may be carried out at any point of the storage or transfer, and may also be actively provided either on an individual wafer and may be compartment basis, section basis, such as each Tec-Cell or FOUP, or on a system wide bases and via any method or ionizing or deionizing machine or solution.

In an embodiment, which may be combined with any other embodiment, the present invention may provide a Fab Level and Load/Unload ability in the T3k-Cell/Zoom Modules, of which may include new load ports, ZOOM/FOUP port loader, of which may all be zoom capable. Additionally, the T3k-Cell/Zoom and associated devices and systems may include AHMS adapter/transport, Zoom adapter and any other adapters and abilities, such as a bottom or top plate which may be structured like FOUP bottom/top plate for the adapters.

In an embodiment, which may be combined with any other embodiment, the present invention may provide where the Zoom modules may be Powered, non-powered, RF powered, wireless charged as well as incorporate Communication possible between Zoom pods to hasten movement, efficiency and fulfill internal system movements and requests in a clean, safe, and organized fashion. Many of the wireless communication may be done via RFID devices within the system, and of which may be third party or proprietary design.

In a preferred embodiment the present invention may provide a substrate manufacturing, processing, transfer or storage system wherein may include at least one or more carriers, wherein each carrier holds a single substrate or wafer and wherein the carriers may be stacked vertically wherein carriers key into each other, such that the substrates held do not touch above or below substrates or carriers.

Additionally in a preferred embodiment, there may be multiple stations including at least one or more storage or stocker stations with storage or stocking containers or compartments where the carriers and substrates may be housed such that one or more opener stations wherein the opener station may be able to transfer carriers from a high density configuration to a low density configuration and vice versa and wherein one or more transfer robots may be able to move the carriers or substrates from one area, position, location or station to another either individually or as a stack.

Additionally there may be a membrane that may isolates each carrier, substrate or wafer from others in a stack, such as to prevent contamination if one wafer, carrier or substrate may be contaminated or breaks etc.

In some embodiments internal to the carrier structure may be a cavity or recess where a purge gas may be able to flow from a source to the substrate such that the purge gas effects each substrate in a laminar flow. Each carrier may then be structured such that the cavity transfers the purge gas from one carrier to the next through the stack such that all or some of the carriers receive purge gas to purge the wafer or substrate.

In some embodiments there may be a transfer station or port includes accessibility by exterior systems of the carriers, stacks of carriers or substrates such as the containers with carriers and substrates include OHT abilities.

In some embodiments there may be one or more and any plurality of robots with one or more effectors wherein there may be at least one wafer or substrate effector, which provides for being able to unload or move at least one wafer or substrate or stack, and at least one carrier effector which provides for being able to unload or move at least one carrier or carrier stack with or without the wafer or substrate.

In some embodiment there may be a separate sorting station or a combination of the opener station and robots may make up a sorting station where a robot takes carriers and substrates or wafers from one stack or multiple stacks and reorganizes them, stacks them or otherwise sorts them such that the robot may be able to sort stack to stack, sub stack to sub stack, individually or any combination or permeation. Additionally, the opener station may be able to access carriers and wafers or substrates stacks in the storage or stocking station through at least one robot, such then the opener station accepts and opens the stack.

In some embodiments the opener may separate the carriers and wafers or substrates through a system that includes at least one pulley wherein the pulley drives a cable with notches, wherein the notches interact with the carriers, and separate the carriers when the pulleys may be driven.

Additionally, the same or another robot may be able to access and remove one or more carriers and wafers or substrates in the opened station, and wherein then the opener station closes the stack into high density configuration to be returned to the storage or stocking station.

In some other embodiments a method or order may include a sorting ability such as wherein each carrier holds a single substrate or wafer and carriers may be stacked vertically such that the substrates held do not touch above or below substrates or carriers and there may be a membrane between each stacked carriers and substrates, and wherein there may be one or more stocker or storage stations, wherein the carriers and substrates may be stacked and stored in a high density formation in the containers or storages. This wherein there may be there may be one or more robots and one or more opener stations wherein first, one or more substrates and carriers may be held in one or more stocker compartments or storages in one or more high density stacks and second, a first stack may be accessed by a robot wherein the robot transfers the first stack to an opener station, wherein the opener station opens the first stack from a high density configuration to a configuration wherein the carriers or substrates may be accessible by a robot.

In some embodiments then the same or a different robot may access one or more carriers or substrates and moves the carriers or substrates to another station, wherein the station may be a transfer port such as an exterior container to be removed from the stocker or in other embodiments the same or a different robot may access a second stack of carriers or substrates in the stocker compartments or storages or in a transfer port such as an exterior container, and moves the second stack such that a second stack may be opened at the same or different opener station, such that the carriers or substrates previously removed may be entered into the second opened stack in any order within the stack, wherein then the second stack then includes the substrates or carriers removed from the first stack. It may be noted this may be performed in any order and permutation.

Although the present embodiments have been described with reference to specific example embodiments, it will be evident that various modifications and changes may be made to these embodiments without departing from the broader spirit and scope of the various embodiments. It should be understood by one of ordinary skill in the art that the terms describing processes, products, elements, or methods may be industry terms and may refer to similar alternatives In addition, the components shown in the figures, their connections, couples, and relationships, and their functions, may be meant to be exemplary only, and may be not meant to limit the embodiments described herein.

FIGS. 1A, 1B, 1C, 1D, 1E and 1F may be profile views of an embodiment of the present invention Tec-Cell.

Tec-Cell. FIGS. 1A, 1B, 1C, 1D, 1E and 1F describe a Tec-Cell carrier configured to pick up a carrier or substrate.

FIG. 1A specifically describes a substrate 110 carrier by carrier 120, wherein the carrier include an arched or design where the wafer may be held and can be stacked easily with other carriers and wafers.

Figure 1B:
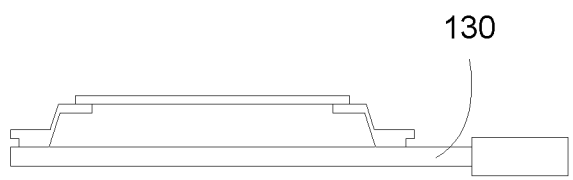

FIG. 1B describes a carrier for supporting a substrate wherein a robot 130 may handle carrier/substrate during transport and storage, thus the substrate may be not touched by the robot, which can reduce damage or contamination, but wherein the robot and robot arm may move the carrier and substrate.

Figure 1E:
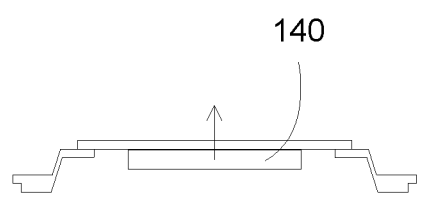
Figure 1C:
Figure 1D:
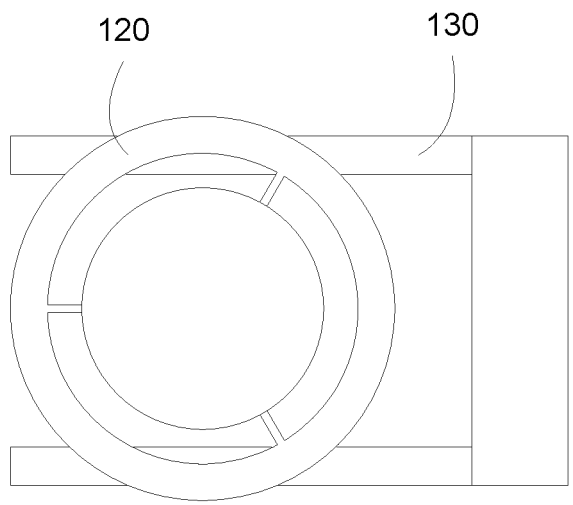
Figure 1F:
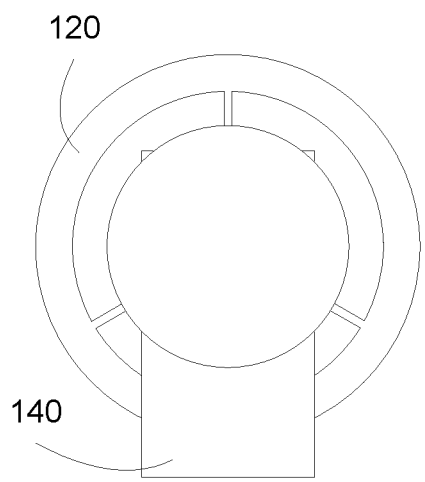

FIG. 1C teaches that the substrate may be stored with the carrier, e.g., placed on the carrier in a storage compartment (in a stocker or in a container) and stacked with other substrates and carriers FIG. 1D displays that the substrate 120 may be transported by moving the carrier or robot 130, e.g., substrate may be placed on carrier, and a robot move the carrier/substrate.

FIG. 1E displays that another robot 140 can be used to handle the substrate, for example, to bring the substrate to a processing station or to remove the substrate from the carrier. The substrate robot can take the substrate when the carrier/substrate may be in container or in storage compartment. In another embodiment the substrate robot can take the substrate when the carrier/substrate may be on the carrier robot FIG. 1F teaches an integrated robot 140, which may include carrier 120 end effector and substrate end effector FIGS. 2A, 2B and 2C may be flow charts of an embodiment of the present invention Tec-Cell.

FIG. 2A teaches at least process 200 forming a carrier, wherein the carrier may be configured to support a substrate, wherein the carrier may be configured to be picked up by a robot.

FIG. 2B teaches at least process 220 picking one or more carriers, by a robot, wherein each carrier may be configured to support a substrate.

FIG. 2C teaches at least process 240 picking a substrate, by a robot, wherein the substrate may be disposed on a carrier, wherein the carrier may be configured to by picked up by another robot FIGS. 3A, 3B, 3C, 3D, 3E, 3F and 3G may be profile views of an embodiment of the present invention Tec-Cell.

FIG. 3A teaches to a single stack carrier pickup, wherein the substrates and carriers may be stacked in a single stack.

FIG. 3B teaches to a bottom support end effector for pickup of one or more carriers. It may be noted that the carriers and stacks may be on different carriers, platform, stockers or containers and may be a robot arm, or any other robot or method such as OHT. FIG. 3C shows a stack on carrier and end effector for picking up multiple carriers.

FIG. 3D teaches to a an embodiment wherein a side effector 310 may pick up one or more carriers and wherein the side grippers may as seen in FIG. 3E move inward to capture the carriers and substrates. FIG. 3F and FIG. 3G teach to the ability of the side grippers to be able to move and grip multiple substrates and carriers, as well as have an optional bottom support to reduce slippage or failure of the gripper.

FIGS. 4A, 4B and 4C may be flow charts of an embodiment of the present invention Tec-Cell.

FIG. 4A teaches at least process 400 Stacking carriers to form a stack of carriers, wherein each carrier may be configured to support a substrate, wherein each carrier and the stack of carriers may be configured to be picked up by a robot FIG. 4B teaches at least process 420 Forming a robot, wherein the robot may be configured to handle a carrier or a stack of carriers, wherein each carrier may be configured to support a substrate FIG. 4C teaches at least process 440 Forming a carrier, wherein the carrier may be configured to support a substrate, wherein the carrier may be configured to be stackable with another carrier for a substrate spacing of less than 5, 4, 3, 2 or 1 mm FIGS. 5A, 5B, 5C, 5D and 5E may be profile views of an embodiment of the present invention Tec-Cell.

Figure 5A:
FIGS. 5A, 5B, 5C, 5D and 5E may be profile views of an embodiment of the present invention Tec-Cell.

FIG. 5A teaches at least on the carrier a sensor 510 such as a wafer presence sensor and at least a communication device 520 such as an RFID telling info about substrate. The communication can be linked to the sensor to report sensor reading, as well as any other information to the overarching system or other systems.

Figure 5B:

FIG. 5B teaches to a carrier with at least connections such as connections 530 and connections 532 of which may be present at any location of the carrier and can be a connection between carriers, such as a power connection to bring power to all carriers, or may be a data connection. It may be noted they may be contact, or wireless, and may match or otherwise interlock or function via contact. Such as views in FIG. 5C.

Figure 5C:
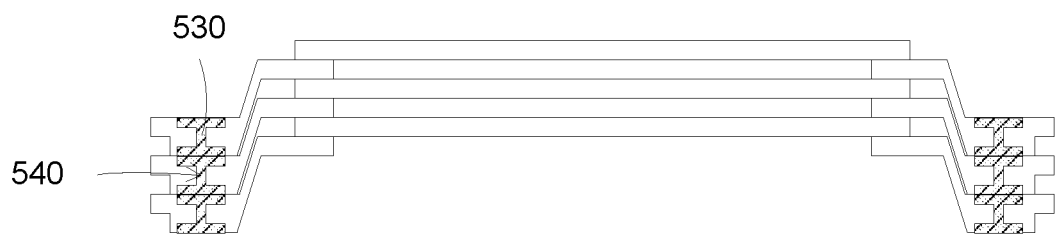

FIG. 5C shows that a connector 540 may connect to a connector 540 on each respective separate carriers.

Figure 5D:
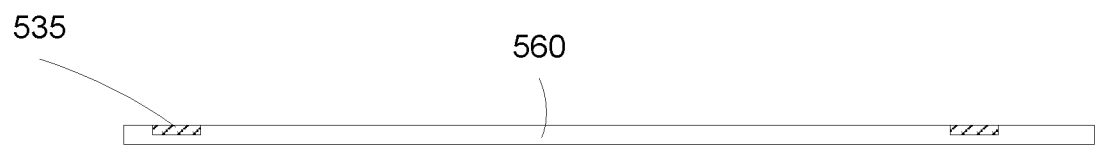

FIG. 5D shows a connection on end effector 560, of which may connect to the carrier which the effector may be used to display position, status, or any other data.

Figure 5E:
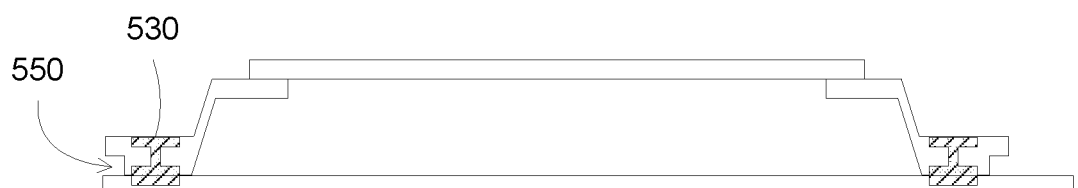

FIG. 5E shows a connector 550 which may connect with connection 530, of which may then relay power, data or any other connection between the carrier and the effector 560, as well as any other stacked carriers and connectors.

FIGS. 6A, 6B, 6C and 6D may be flow charts of an embodiment of the present invention Tec-Cell.

FIG. 6A teaches at least process 600 installing at least one of a sensor and a communication module on a carrier, wherein the carrier may be configured to support a substrate FIG. 6B teaches at least process 620 forming at least an electrical connector on a carrier, wherein the electrical connector may be configured to form an electrical connection with another electrical connector of another carrier.

FIG. 6C teaches at least process 640 forming at least an electrical connector on a robot, wherein the electrical connector may be configured to form an electrical connection with another electrical connector on a carrier, wherein the carrier may be configured to support a substrate FIG. 6D teaches at least process 660 picking a carrier by a robot, wherein the carrier comprises a first electrical connector, wherein the robot comprises a second electrical connector, wherein the first and second electrical connectors may be configured to form an electrical connection when the robot picks up the carrier FIGS. 7A, 7B, 7C, 7D and 7E may be profile views of an embodiment of the present invention Tec-Cell. FIGS. 7A, 7B, 7C, 7D and 7E teach to embodiment with substrate protection methods, devices and systems.

Figure 7A:
FIGS. 7A, 7B, 7C, 7D and 7E may be profile views of an embodiment of the present invention Tec-Cell.

FIG. 7A teaches to a membrane 710 in the carrier under the substrate.

Figure 7B:
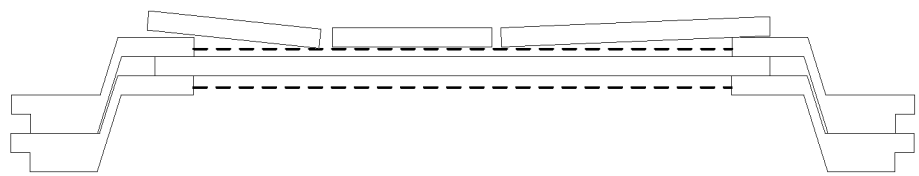

FIG. 7B teaches to a broken substrate being held by the membrane, wherein the below substrate or substrates may be then not contaminated or damaged by the broken substrate.

Figure 7C:
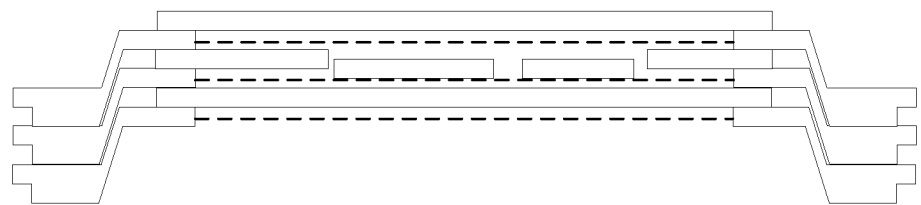

FIG. 7C teaches to a broken substrate, wherein the substrates below and above may be not damaged or contaminated by the broken substrates, and wherein the carriers may be still able to be stacked when a substrate beaks.

Figure 7D:
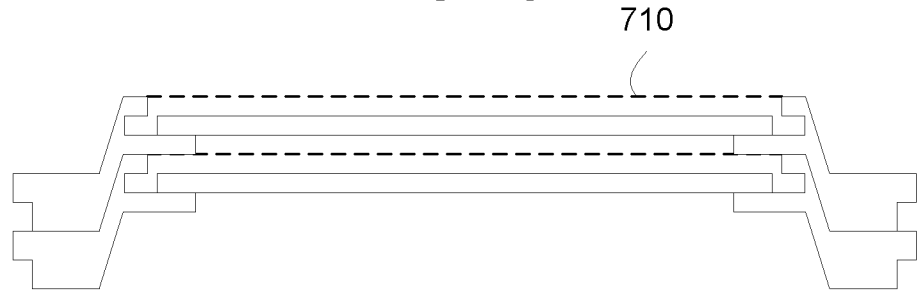

FIG. 7D teaches to a membrane 710 in the carrier may be above and not below the substrate. It may be noted that in some embodiments, there may be a mixture of membranes on top and below, and as such the membrane and carriers may be designed to be able to stack all of one, all of the other, or a combination of both.

Figure 7E:
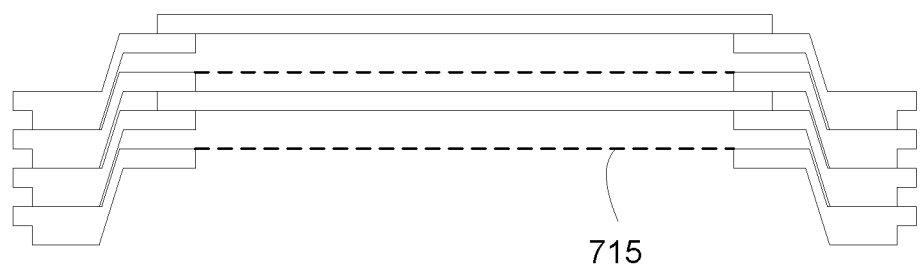

FIG. 7E teaches to wherein the membrane and substrate may be separate and wherein there may be a special carrier having a membrane only, a carrier for a substrate only. It may be noted the membrane carrier can be thinner than the substrate carriers, such as to take less weight and room wherein the membrane weighs less and may be thinner than a substrate such as to have higher substrate density in a given stack.

FIGS. 8A and 8B may be flow charts of an embodiment of the present invention Tec-Cell.

FIG. 8A teaches at least process 800 Forming a protective element on a carrier, wherein the carrier may be configured to support a substrate.

FIG. 8B teaches at least process 820 Forming a membrane on a first carrier, wherein the first carrier may be configured to be stackable with a second carrier, wherein the second carrier may be configured to support a substrate.

FIGS. 9A, 9B, 9C and 9D may be profile views of an embodiment of the present invention Tec-Cell wherein purge gas may be introduced to the wafer or substrate.

Figure 9A:
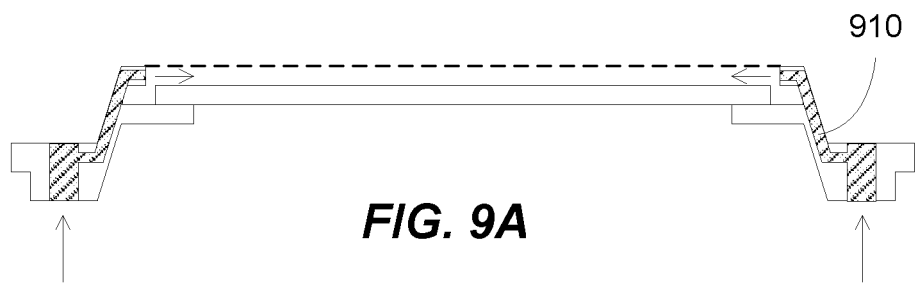
FIGS. 9A, 9B, 9C and 9D may be profile views of an embodiment of the present invention Tec-Cell.

FIG. 9A shows a purge gas ability wherein a channel 910 may introduce purge gas to each wafer.

Figure 9B:
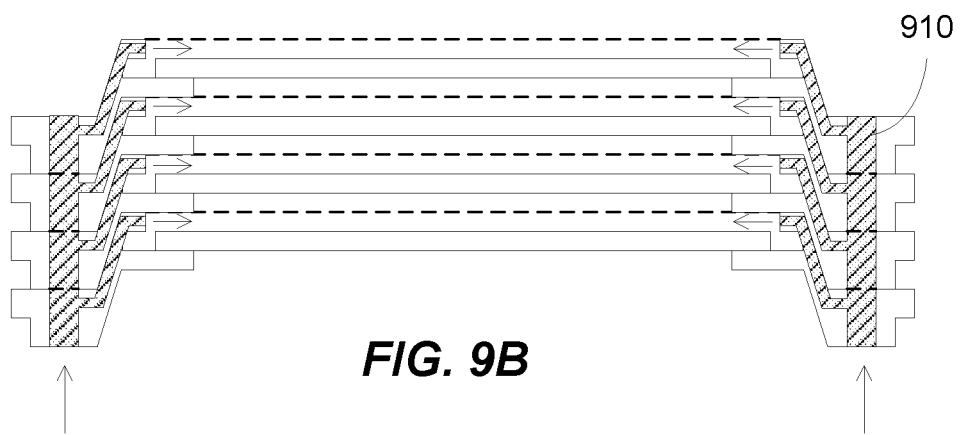

FIG. 9B shows a carrier having a top or any other location membrane for protection and for confining he purge gas to the channel to only be guided to the substrate or wafer. 910 may be a purge line or channel in the carrier. Also the channels may connect between each carrier and may transfer gas between the carriers.

Figure 9C:
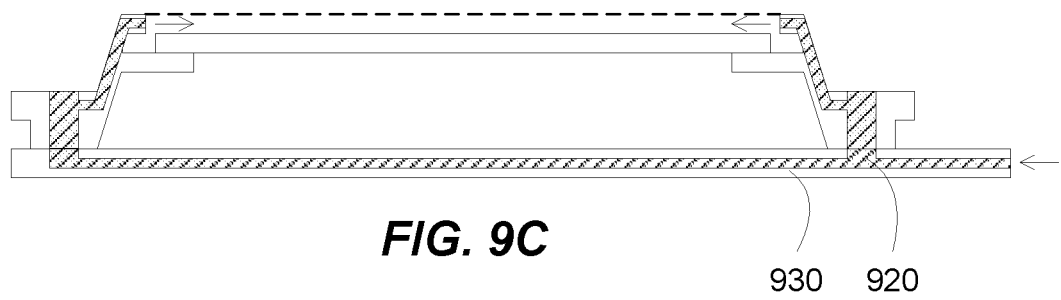

FIG. 9C shows a purge line 920 in the effector 930 which may connect to the purge gas channels in the carriers.

Figure 9D:
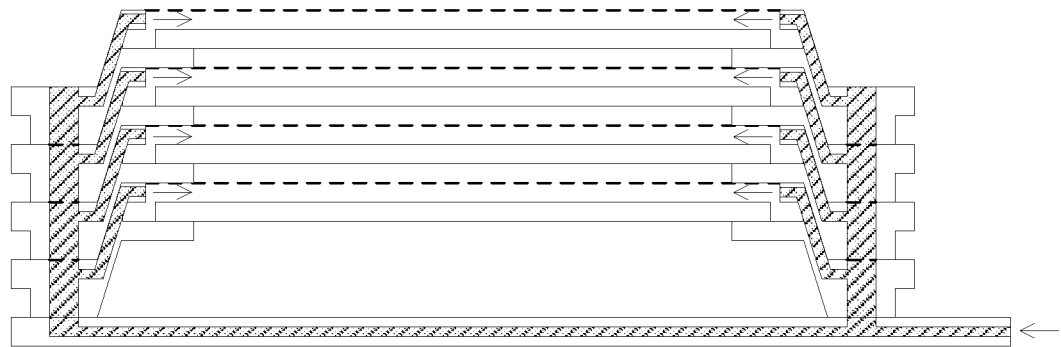

FIG. 9D shows the purge gas flowing in a channel in the effector, traveling to at least both sides of the carrier, flowing to multiple carriers and then to the wafer for purging.

FIGS. 10A, 10B and 10C may be flow charts of an embodiment of the present invention Tec-Cell.

FIG. 10A teaches at least process 1000 Forming a purge channel on a carrier, wherein the carrier may be configured to support a substrate, wherein the purge channel may be configured to provide a purge gas to the substrate.

FIG. 10B teaches at least process 1020 forming a purge connection on a carrier, wherein the carrier may be configured to support a substrate, wherein the purge connection may be configured to be coupled with other purge connections of other carriers to provide a purge gas to the substrate.

FIG. 10C teaches at least process 1040 forming a purge connection on a robot, wherein the purge connection may be configured to couple with another purge connection on a carrier, wherein the carrier may be configured to support a substrate, wherein the purge connection may be configured to provide a purge gas to the substrate.

FIGS. 11A, 11B, 11C and 11D may be profile views of an embodiment of the present invention Tec-Cell.

FIG. 1A teaches to the carriers 1110 stacked for high density, wherein the space between each carrier may be small for space savings, but too closed to have a robot move each carrier. Thus an opener may be needed to enlarge the spacing for robot.

FIG. 11B shows an opener for wafer, wherein at least one carrier may be moved upward such that a top and bottom portion may be separated such that a carrier can be picked up such as carriers 1120 moved so that a carp 1130 and 1140 exists such that robot 1150 can moved a carrier. Such as a single carrier.

FIG. 11C shows an opener for a portion of a stack of wafers and carriers such as a stack of carriers and wafers 1122 moved up such that a gap 1132 and 1142 exists so that robot 1152 can moved the stacked carriers, such as more than one carrier.

FIG. 11D shows an opener for all wafers such that each carrier may be separated from the other carriers, which may ease random access or on demand access of each carrier. Such as a gaps 1160, 1162, 1164, 1166, and 1168 may exist such that the wafers and carrier may be accessed.

Figure 12A:
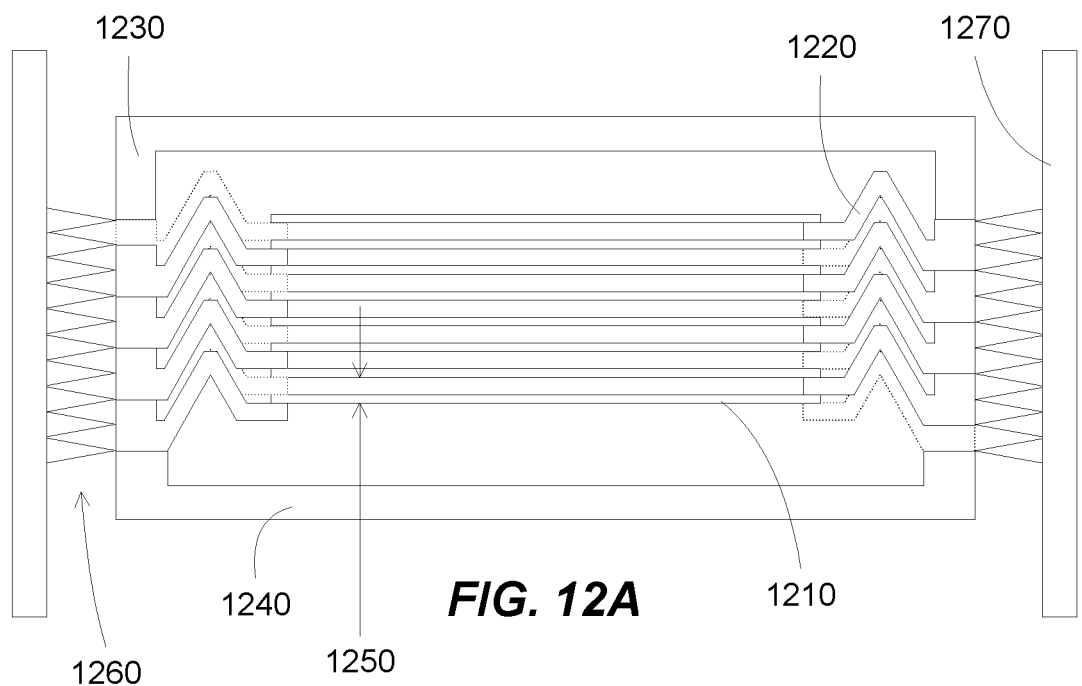
FIGS. 12A and 12B may be profile views of an embodiment of the present invention Tec-Cell.
Figure 12B:
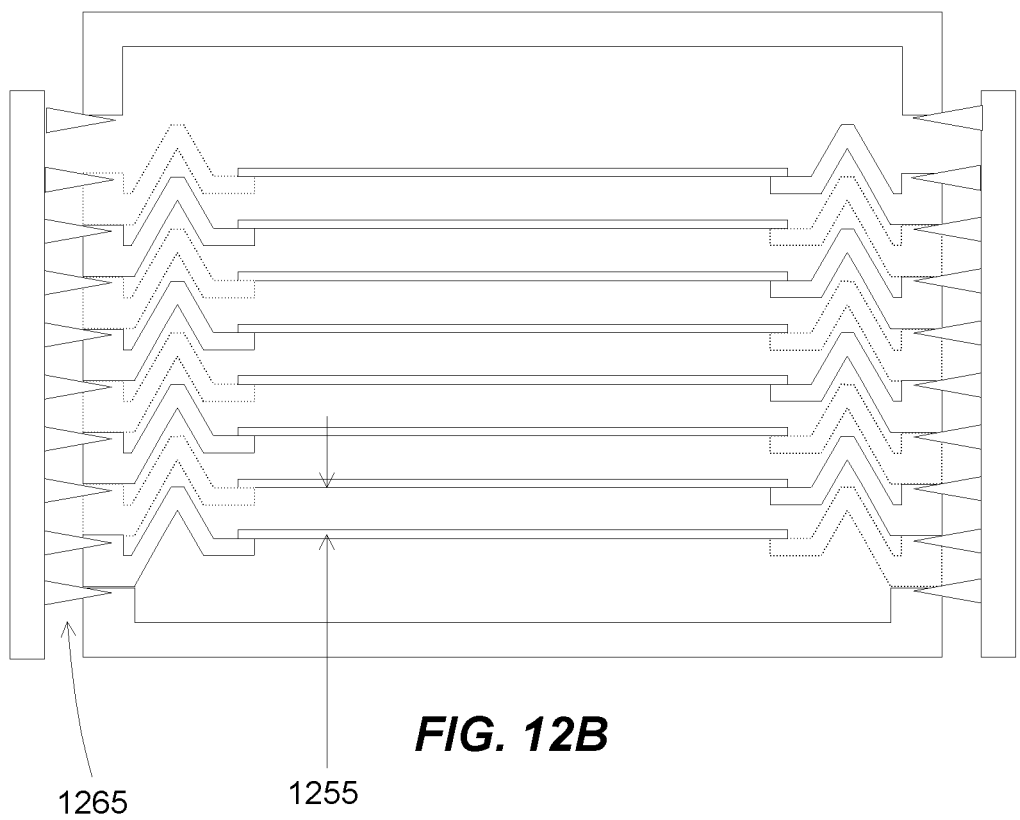

FIGS. 12A and 12B may be profile views of an embodiment of the present invention Tec-Cell.

FIG. 12A describes an opener station in the closed position wherein a stack of Tec-Cell may be placed in the opener station and the separation 1250 of the wafers may be minimal (order of 1-5 mm), for example, by separators 1270 having pins at the same separation 1260.

FIG. 12B describes an opener station in the separated position wherein the Tec-Cells may be separated and wherein the separation 1255 of the wafers may allow for robot to pick up. The increase in separation can be caused by separators 1270 having pins at the higher separation 1265.

It may be noted that the pins and separators may be of any design or type and that there may be different opener configurations such as all wafers may be separated at the same distance or the separation distance may be varied, or that some wafers and carriers may be separate and some may not.

Figure 13A:
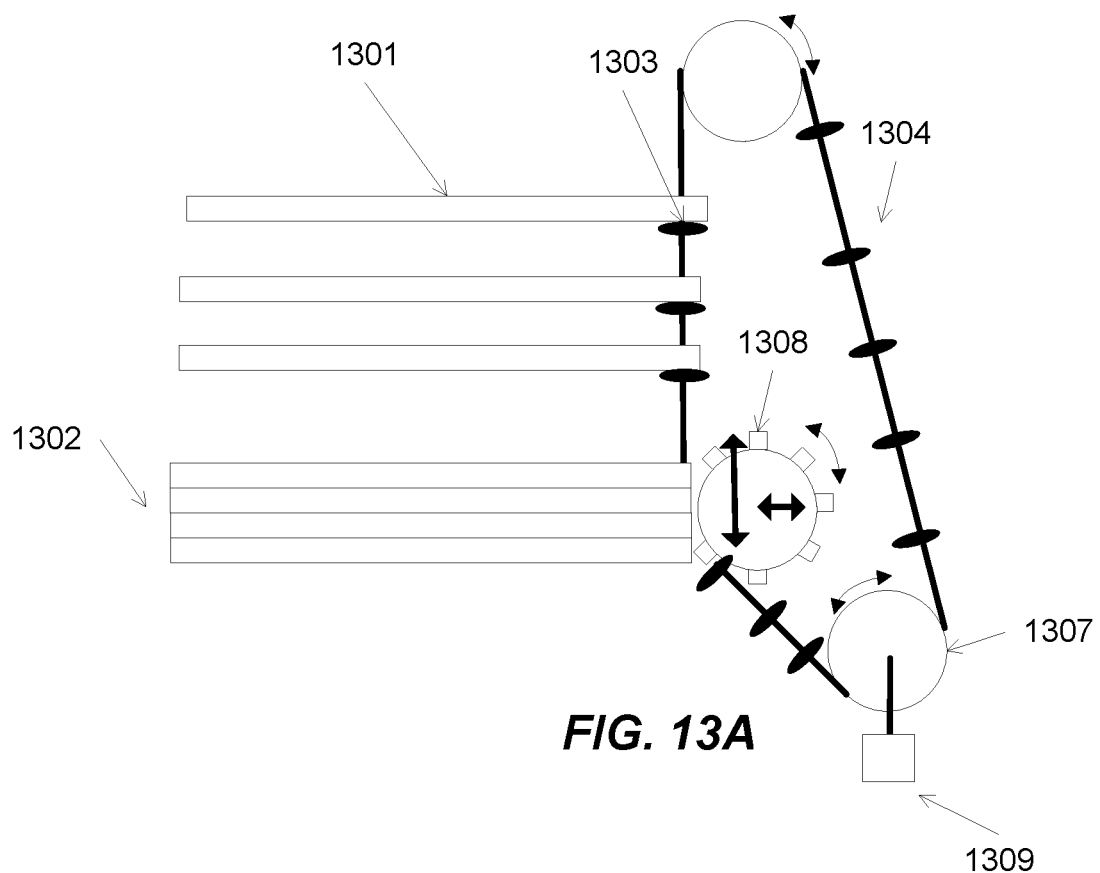
FIGS. 13A and 13B may be profile views of an embodiment of the present invention Tec-Cell.
Figure 13B:
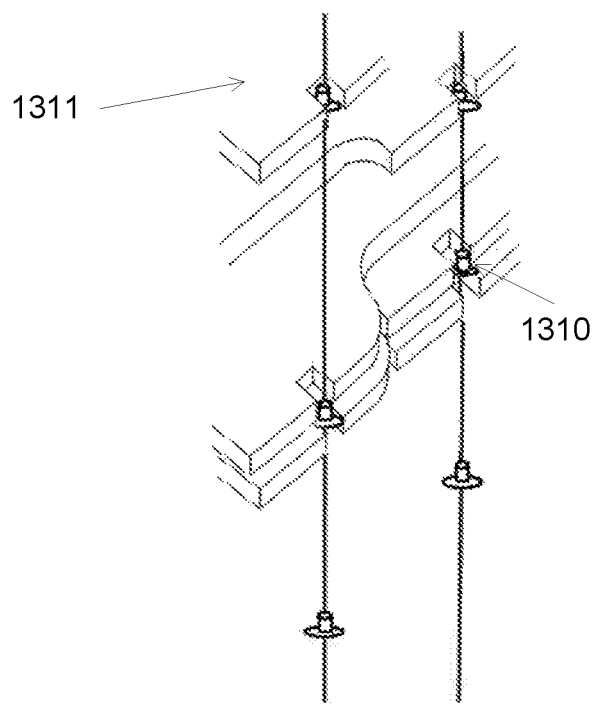

FIGS. 13A and 13B may be profile views of an embodiment of the present invention Tec-Cell.

FIG. 13A teaches to an alternative embodiment of a separation wherein the separation may provide for a wire or belt where a folder or fixed pitch in terms of the carriers and may include notches or interlocks to locked into the carrier, such that each interlock carriers a carrier and separates the carrier. A tensioning device may tension the belt or wire and a motor may provide separation. The interlock or notches may key in or otherwise support the carriers on the wire or belt such that when the belt moves in a direction, the carriers move such to provide separation.

As seen in the FIG. 13A there may be a stack of carries with or without wafers or substrates 1302 wherein an opener or separate device may separate the stack into individual carriers 1301. There may be notes or tangs on a wire, rope, belt, etc. 1304, wherein the tang such as 1303 may separate a carrier 1301 from a stack 1302. The belt may be provided with pulleys 1308, 1307 among others that may provide the ability to include movement to aid in opening or tension, and also may include a spring tensioner or other tensioning device 1309.

FIG. 13B shows details of the tangs 1310 or rest which may notch into the carrier 1311 and may lift or otherwise lower or move the carriers into or from a high density configuration or stack.

FIGS. 14A, 14B and 14C may be flow charts of an embodiment of the present invention Tec-Cell.

FIG. 14A teaches at least process 1400 separating a spacing between carriers to allow one or more carriers to be picked up.

FIG. 14B teaches at least process 1420 identifying first carriers to be picked up in a stack of carriers, process 1430 separating second carriers from the first carriers, wherein the second carriers may be disposed above or below the first carriers in the stack and process 1440 Removing the first carriers from the stack.

FIG. 14C teaches at least process 1460 increasing all spacing between carriers in a stack of carriers and process 1470 sequentially removing the carriers from the stack FIGS. 15A and 15B may be flow charts of an embodiment of the present invention Tec-Cell.

FIG. 15B A teaches at least process 1500 Transferring a stack of substrates, wherein the substrates comprise a first pitch, process 1510 Separating the stack of substrates so that the substrates comprises a second pitch larger than the first pitch and process 1520 Transferring individual substrates at the second pitch.

FIG. 15B teaches at least process 1540 Transferring individual substrates to form a stack of substrates, wherein the substrates comprise a first pitch, process 1550 Collapsing the stack of substrates so that the substrates comprises a second pitch smaller than the first pitch and process 1560 Transferring the stack of substrates.

Figure 16A:
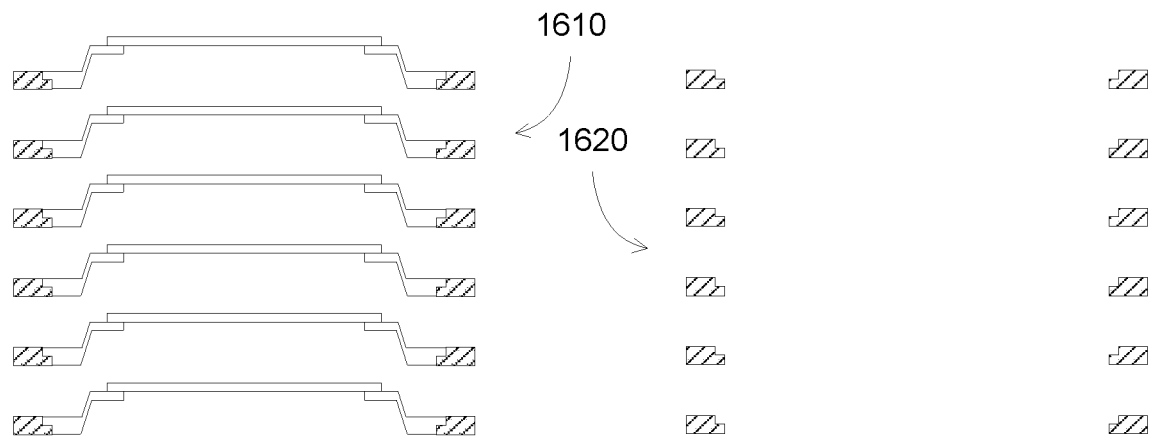
FIGS. 16A, 16B and 16C may be profile views of an embodiment of the present invention Tec-Cell.
Figure 16B:
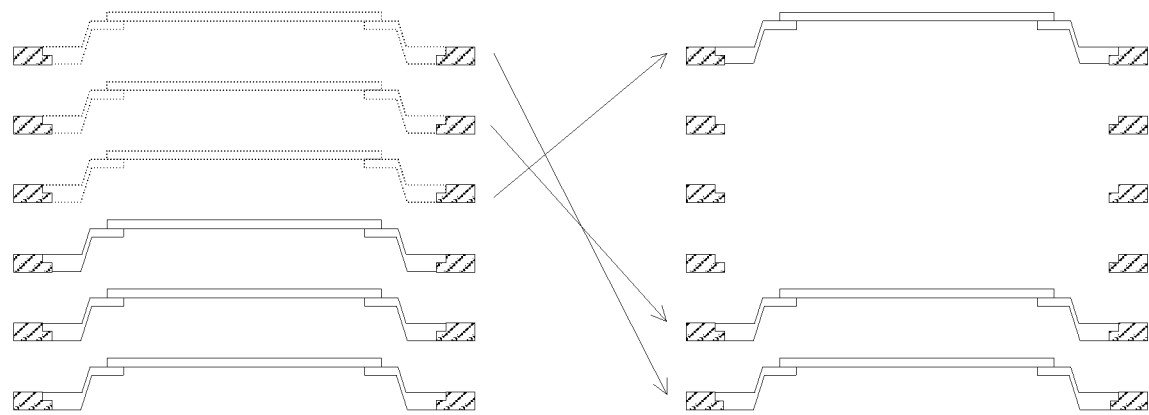
Figure 16C:
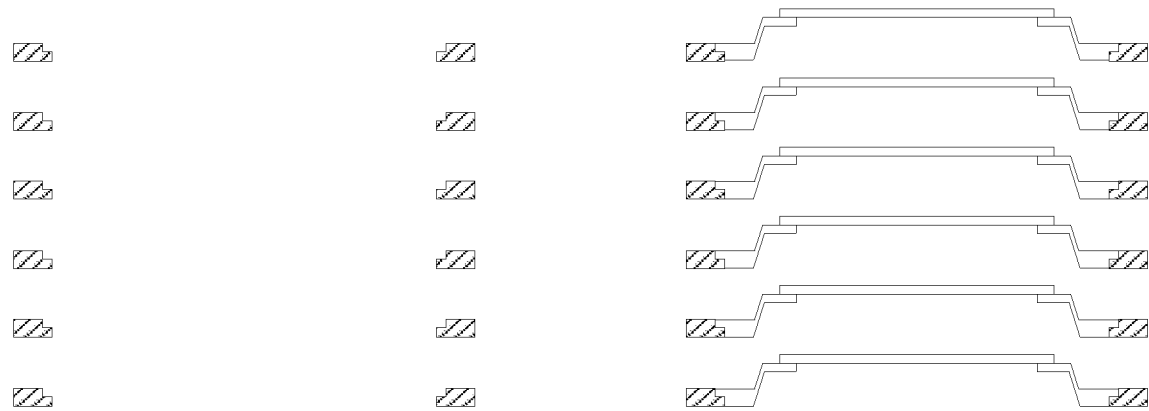

FIGS. 16A, 16B and 16C may be profile views of an embodiment of the present invention Tec-Cell.

FIG. 16A teaches to a sorter wherein the sorter may include a first position 1610 and a second position 1620.

FIG. 16B then shows the sorter moving wafers from a first position to a second position, but in different parts or orders of the stack. It may be noted that this movement may be done by any robot, order or process and the wafers may move between any plurality of positions, stacks and directions. The sort may sort by moving the carrier and include an opener to open proper slots, stacks etc.

FIG. 16C shows a random sorter complete wherein the opener may be open to all slots, but also may in other embodiment on need some slots opened.

FIGS. 17A, 17B, 17C, 17D and 17E may be profile views of an embodiment of the present invention Tec-Cell wherein moving single carrier and stack of carriers depending on sort order.

Figure 17A:
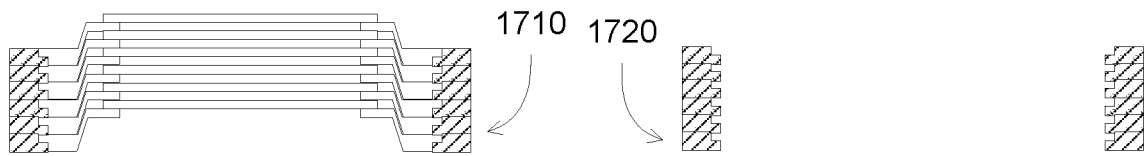
FIGS. 17A, 17B, 17C, 17D and 17E may be profile views of an embodiment of the present invention Tec-Cell.
Figure 17B:
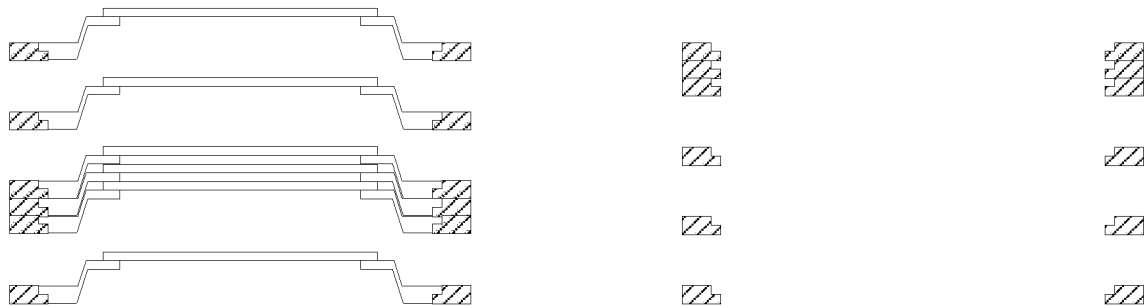

FIG. 17A shows a sorter wherein a stack of carriers and wafers in position 1710 may be sorted or moved to a position 172.

FIG. B shows that the stack as seen in FIG. 17A may be part of a larger stack, and wherein the stack or portions of stack, or single carriers may be moved.

Figure 17C:
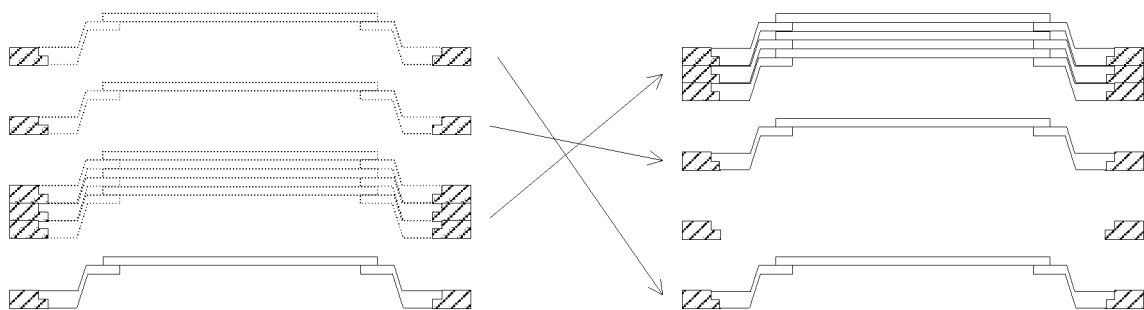

FIG. 17C shows that a portion of the stack, or individual wafers, or the stack as a whole may be moved to any position, order, etc. and that the opener can only need to open on either starting or ending position some of the stack.

Figure 17D:
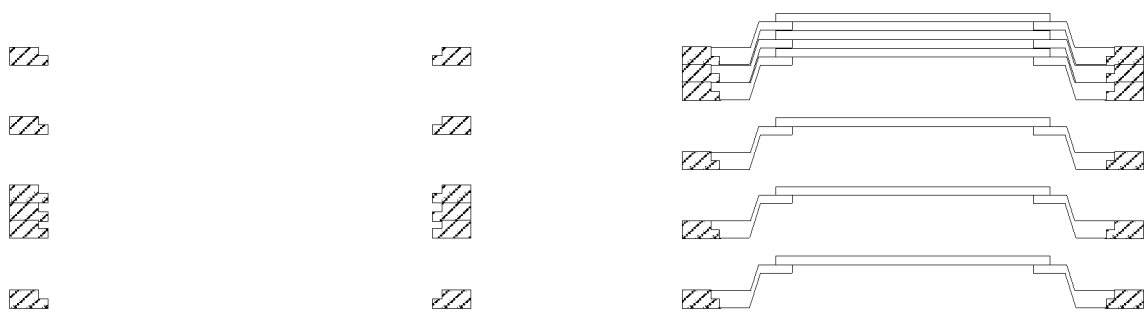

FIG. 17D shows the wafers reorganized or orders, and wherein the opener has some of the stacks open and some closed.

Figure 17E:

FIG. 17E shows the stack closed after reorganized, wherein the opened stacks and individual wafers may be closed to a high density configuration by the opener station or position.

Figure 18A:
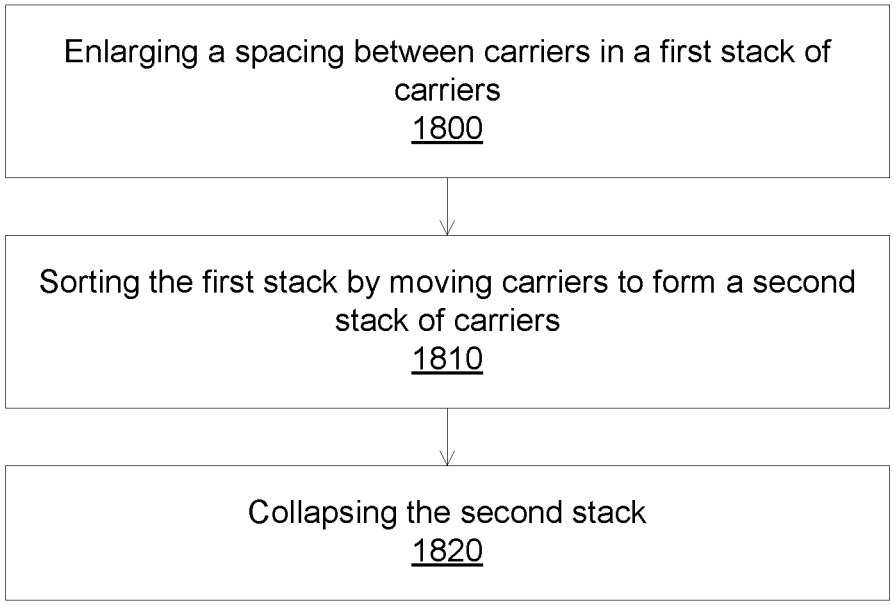
FIGS. 18A, and 18B may be flow charts of an embodiment of the present invention Tec-Cell.
Figure 18B:
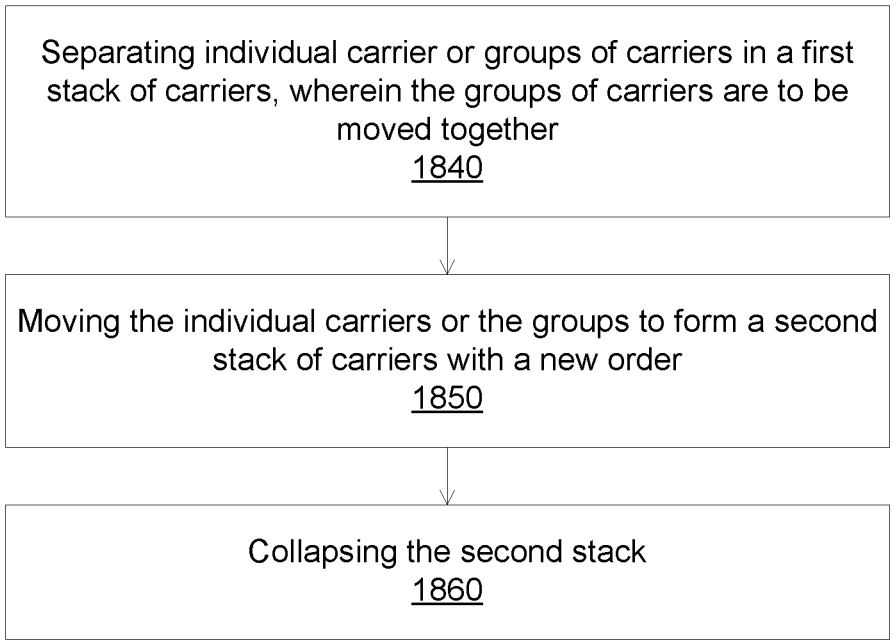

FIGS. 18A, and 18B may be flow charts of an embodiment of the present invention Tec-Cell.

FIG. 18A teaches at least process 1800, enlarging a spacing between carriers in a first stack of carriers process 1810 sorting the first stack by moving carriers to form a second stack of carriers and process 1820 collapsing the second stack.

FIG. 18B teaches at least process 1840 Separating individual carrier or groups of carriers in a first stack of carriers, wherein the groups of carriers may be to be moved together, process 1850 moving the individual carriers or the groups to form a second stack of carriers with a new order and process 1860 collapsing the second stack.

FIGS. 19A, 19B, 19C, 19D, 19E and 19F may be profile views of an embodiment of the present invention Tec-Cell.

Figure 19A:
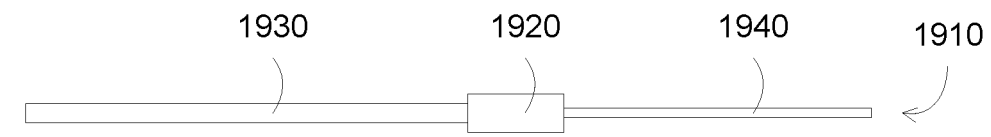
FIGS. 19A, 19B, 19C, 19D, 19E and 19F may be profile views of an embodiment of the present invention Tec-Cell.

FIG. 19A teaches an integrated robot 1910 with integrated end effector 1930 and integrated end effector 1930 and with body 1920, wherein one of the end effectors may be for handling at least one carrier of which may or may not have a wafer or substrate and the other end effector may be for handling the bare substrate or wafer.

Figure 19B:
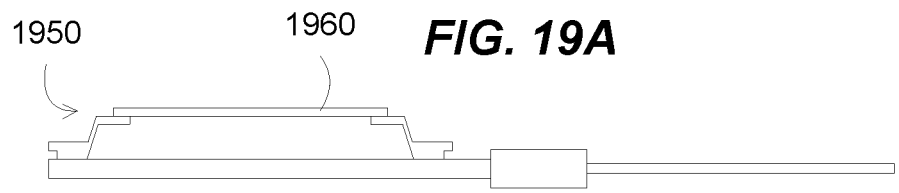

FIG. 19B teaches to an integrated robot 1910 with integrated end effector 1930 and integrated end effector 1930 and with body 1920, wherein one of the end effectors may be for handling at least one carrier 1950 of which may or may not have a wafer or substrate 1960.

Figure 19C:

FIG. 19C teaches to an integrated robot 1910 with integrated end effector 1930 and integrated end effector 1930 and with body 1920, wherein one of the end effectors may be for handling at least a bare substrate 1960.

Figure 19D:
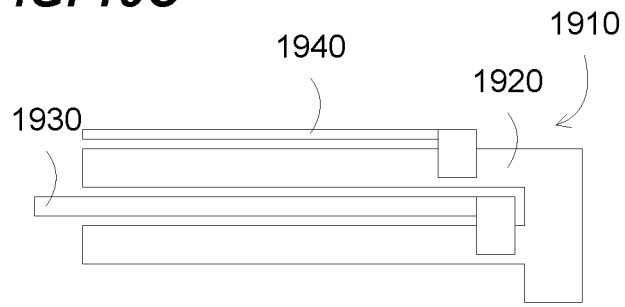

FIG. 19D teaches to a robot with retractable end effectors wherein shows may be for handling one carrier, but wherein some embodiment may have more than one carrier. Shown in robot 1910 with body 120 wherein an effector for carriers 1940 may be retracted and carriers for substrates 1930 may be retracted. It may be noted the method of retraction and design can be of any type by any include retractable or swing arms and that the carrier arms and substrate arms may be in any position or location.

Figure 19E:
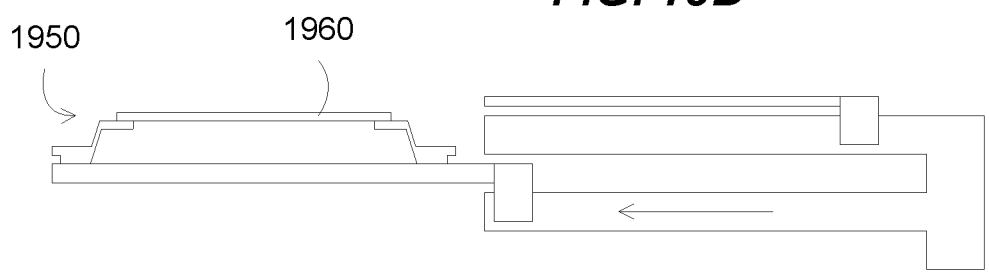

FIG. 19E shows a carrier arm extended with carrier 1950 and substrate 1960.

Figure 19F:
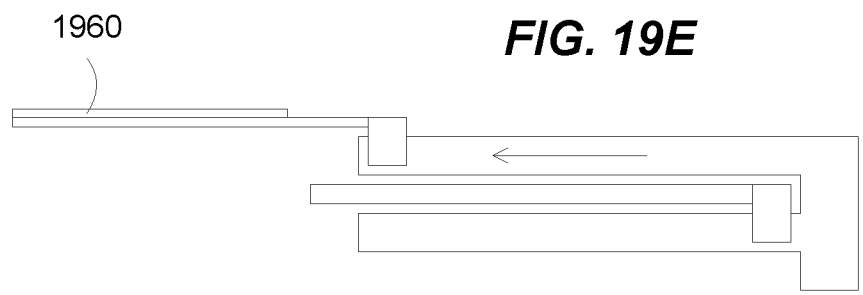

FIG. 19F shows a substrate arm extended with substrate 1960.

Figure 20A:
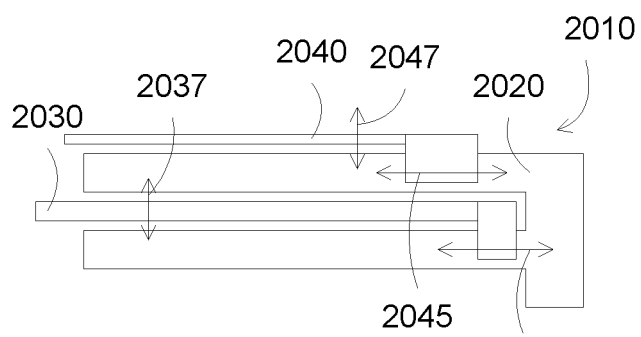
FIGS. 20A, 20B, 20C, 20D and 20E may be profile views of an embodiment of the present invention Tec-Cell.

FIGS. 20A, 20B, 20C, 20D and 20E may be profile views of an embodiment of the present invention Tec-Cell. The embodiment may teach to wherein the integrated robot can include an ability wherein the substrate end effector can also handle substrate with the substrate/carrier may be on the carrier end effector FIG. 20A shows a robot 2010 with body 2020 herein the substrate effector arm 2040 may be retractable and with mount and may be able to move in the up and down direction 2047 and the side to side direction 2045, wherein the effector arm may be moveable in any 3D space. The carrier effector arm 2030 may also be moveable in a side to side movement 2035 and an up and down movement 2037.

Figure 20B:
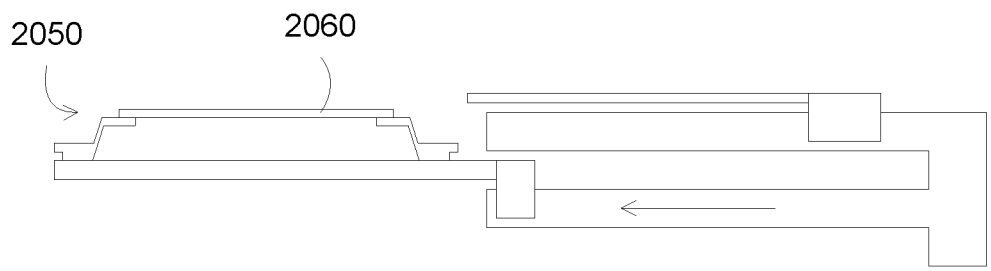

FIG. 20B teaches to the carrier arm extended and holding carrier 2050 with substrate 2060

Figure 20C:
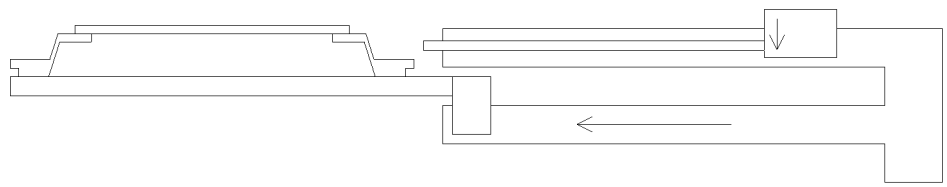

FIG. 20C shows that the substrate effector arm can moves such that the substrate effector arm can position to handle the substrate.

Figure 20D:
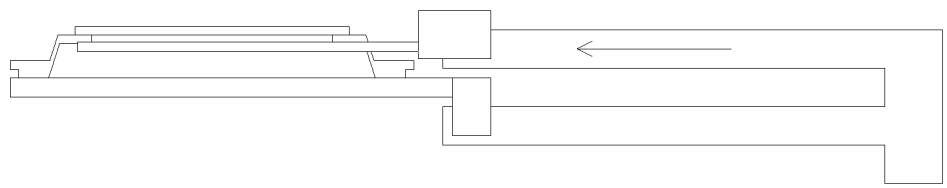

FIG. 20D teaches to the substrate effector arm handling the substrate.

Figure 20E:
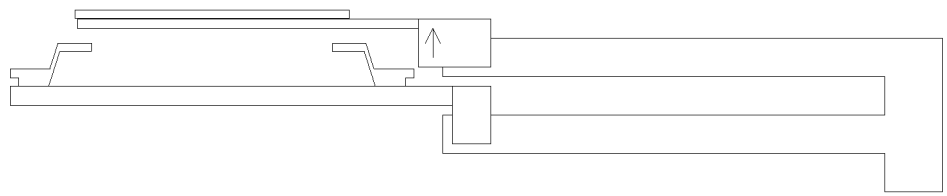

FIG. 20E shows that the substrate arm can handle the substrate while the substrate and carrier may be being held by the robot.

FIGS. 21A, 21B and 21C may be flow charts of an embodiment of the present invention Tec-Cell.

FIG. 21A teaches to at least a process 2100 forming a robot, wherein the robot comprises a first handler for handling carriers and a second handler for handling substrates.

FIG. 21B teaches to at least a process 2120 picking one or more carriers by a first handler of a robot and process 2130 picking a substrate by a second handler of the robot FIG. 21C teaches to at least a process 2150 picking a carrier by a first handler of a robot and process 2160 picking a substrate on the carrier by a second handler of the robot.

FIGS. 22A, 22B, 22C and 22D may be profile views of an embodiment of the present invention Tec-Cell wherein includes container for storage.

Figure 22A:
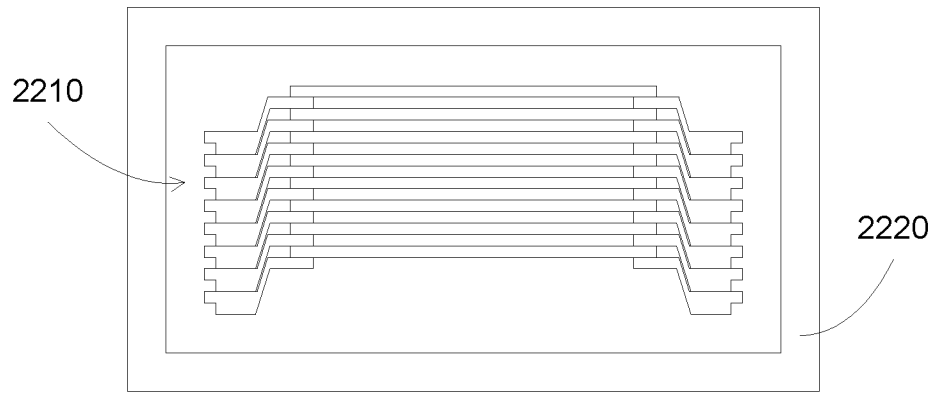
FIGS. 22A, 22B, 22C and 22D may be profile views of an embodiment of the present invention Tec-Cell.

FIG. 22A teaches to a stack of substrates and Tec-Cell carriers 2210 condensed into Tec-Cell high density configuration wherein the storage or container 2220 contains, stores or holds the stack 2210. It may be noted the wafers, Tec-cells, carriers and stacks may be of any plurality.

Figure 22B:
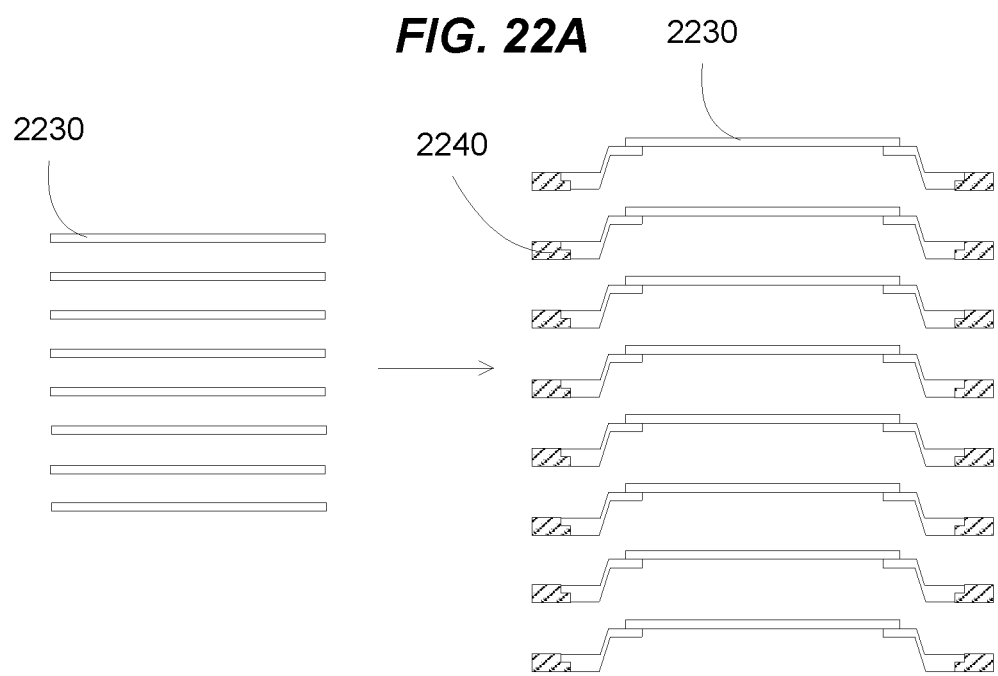

FIG. 22B shows substrates 2230 from FOUPs may be transferred to carrier Tec-Cell carriers 2240, which may include an opener and in the opener position.

Figure 22D:
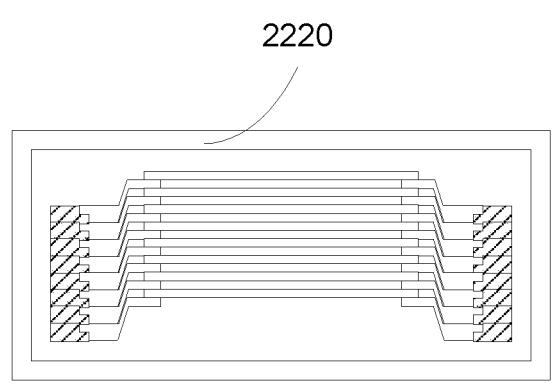
Figure 22C:
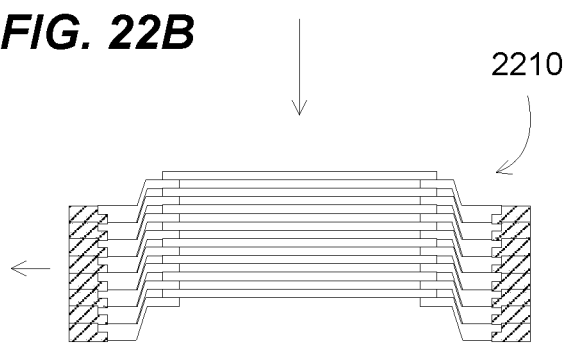

FIG. 22C then shows the stack 2210 closed after receiving the substrates on the carriers.

FIG. 22D shows the stack in the container 2220. It may be noted the stacks may be moved in any method.

FIGS. 23A, 23B and 23C may be profile views of an embodiment of the present invention Tec-Cell.

FIG. 23A shows that two stacks of wafers such as stack one 2330 and stack 2335, from two or more FOUPs and of any plurality of FOUPs and wafers may be combine to be stacked in a high capacity Tec-Cell carrier such that the stacks become one stack in the Tec-Cell carriers.

FIG. 23B shows the aforementioned combined stack 2310 of wafers.

FIG. 23C shows that the stack 2310 in high density form or position may be in a high density container or storage 2320.

Figure 24A:
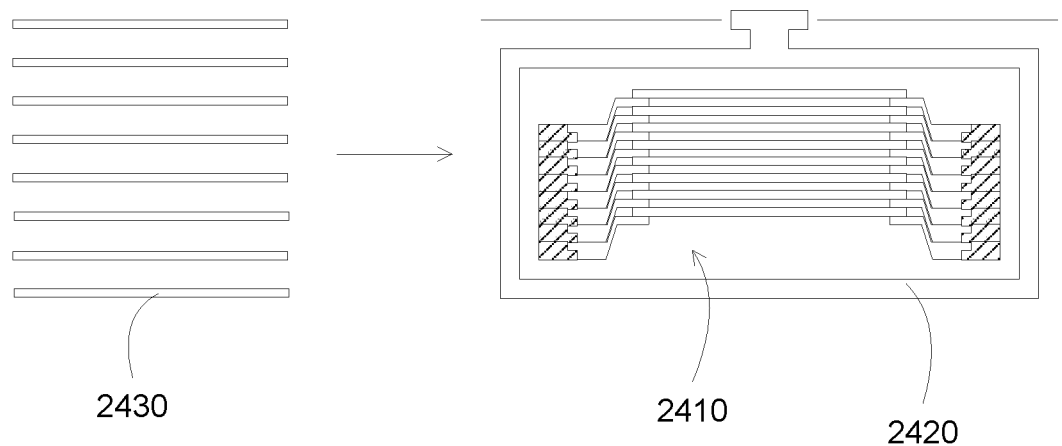
FIGS. 24A and 24B may be profile views of an embodiment of the present invention Tec-Cell.
Figure 24B:
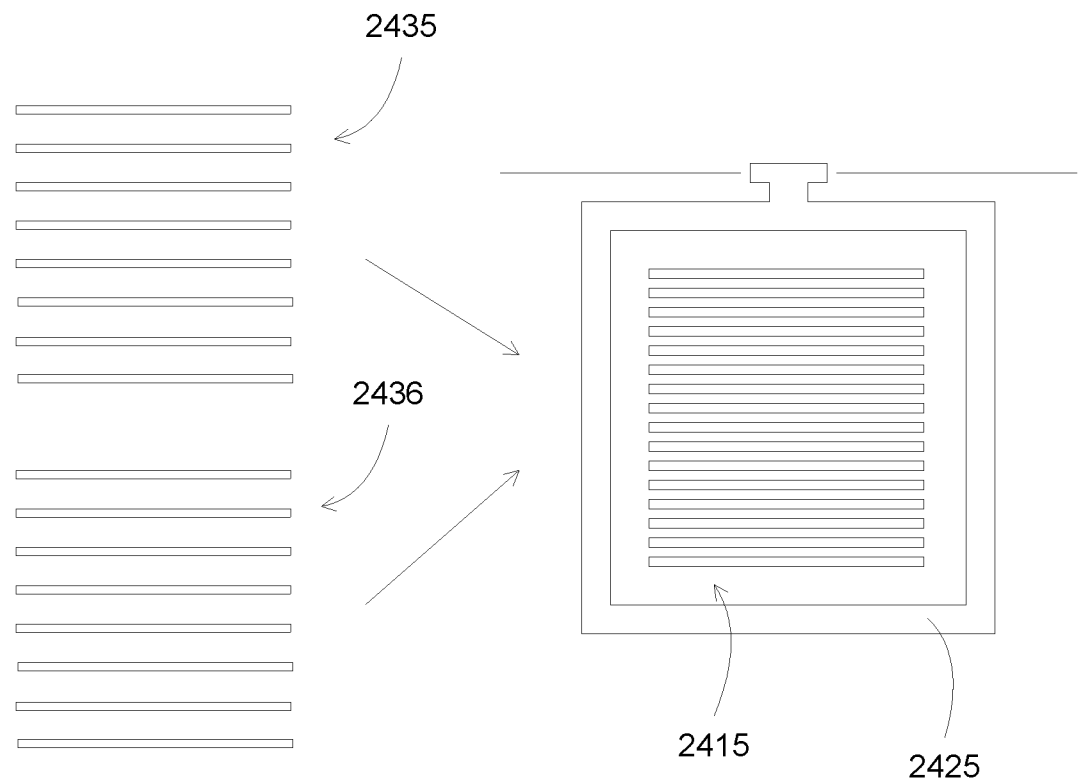

FIGS. 24A and 24B may be profile views of an embodiment of the present invention Tec-Cell.

FIG. 24A shows that a stack of wafers 2430 from any source may be put on Tec-Cell carriers such as in stack 2410 and then placed in a carrier 2420 of which may include OHT (Overhead transport) or any other transport abilities.

FIG. 24B shows two stacks such as stack one 2435 and stack two 2436 which may be combine into one stack 2415 of which can be in Tec-Cell high density carriers and position such that it may be contained in container 2425 which may have OH of other transport abilities.

FIGS. 25A, 25B and 25C may be flow charts of an embodiment of the present invention Tec-Cell.

FIG. 25A includes at least Process 2500 wherein at least storing a stack of carriers in a container, wherein the carriers may be configured to support substrates.

FIG. 25B includes at least Process 2520 wherein at least consolidating two or more sets of substrates to form a stack of substrates, wherein the stack of substrates comprises a smaller spacing than a spacing of the sets of substrates and process 2530 storing the stack of substrates in a container.

FIG. 25C includes at least Process 2550 wherein at least forming a stack of carriers or substrates, Process 2560 wherein at least Placing a stacking a container, and Process 2570 wherein at least transferring or storing the container.

A number of embodiments have been described. Nevertheless, it will be understood that various modifications may be made without departing from the spirit and scope of the claimed invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments may be within the scope of the following claims.

It may be appreciated that the various systems, methods, and apparatus disclosed herein may be embodied in a machine-readable medium and/or a machine accessible medium compatible with a data processing system (e.g., a computer system), and/or may be performed in any order.

The structures and modules in the figures may be shown as distinct and communicating with only a few specific structures and not others. The structures may be merged with each other, may perform overlapping functions, and may communicate with other structures not shown to be connected in the figures. Accordingly, the specification and/or drawings may be regarded in an illustrative rather than a restrictive sense.

What is claimed is:

1. A substrate manufacturing, processing, transfer or storage system comprising:
    one or more carriers; and
    a plurality of stations; wherein
        each of the one or more carriers holds a single substrate;
        each of the one or more carriers is configured to be vertically stackable and key into a different carrier in a manner in which the single substrates held does not touch above or below substrates or carriers;
    the plurality of stations include:
        one or more storage or stocker stations that include storage or stocking containers or compartments in which the one or more carriers are housed;
        one or more opener stations that are able to transfer the one or more carriers from a high density configuration to a low density configuration and vice versa; and
        one or more transfer robots that are able to move the one or more carriers or substrates from one area, position, location or station to another either individually or as a stack;
    each of the one or more opener stations includes:
        a belt; and
        a pulley that drives the belt;
    the belt includes a plurality of tangs which notch into corresponding notches in an individual carrier; and
    the belt is driven by the pulley such that one of the plurality of tangs interlocks with the individual carrier to move or separate the one or more carriers and open the stack by separating the carriers.

2. The substrate manufacturing, processing, transfer or storage system according to claim 1, wherein a membrane is located between each of the stacked carriers and its corresponding substrate.

3. The substrate manufacturing, processing, transfer or storage system according to claim 2, wherein the membrane isolates each of the carriers and its corresponding substrate from other carriers or substrates in the stack to prevent contamination if one carrier or substrate is contaminated or breaks.

4. The substrate manufacturing, processing, transfer or storage system according to claim 1, wherein internal to the carrier structure is a cavity or recess in which a purge gas is able to flow from a source to the substrate.

5. The substrate manufacturing, processing, transfer or storage system according to claim 4 wherein the purge gas affects each substrate in a laminar flow.

6. The substrate manufacturing, processing, transfer or storage system according to claim 4, wherein the carriers are structured such that the cavity or recess transfers the purge gas from one carrier to a next carrier through the stack such that all or some of the carriers receive purge gas to purge the substrate.

7. The substrate manufacturing, processing, transfer or storage system according to claim 1, wherein the one or more storage or stocker stations accepts the carriers when stacked or individually in a high density configuration for a high density and clean storage.

8. The substrate manufacturing, processing, transfer or storage system according to claim 1, wherein the plurality of stations includes a transfer station or port which includes accessibility by exterior systems of the carriers, stacks of carriers, or substrates.

9. The substrate manufacturing, processing, transfer or storage system according to claim 8 wherein the storage or stocking containers or compartments with carriers and substrates include overhead transport (OHT) abilities.

10. The substrate manufacturing, processing, transfer or storage system according to claim 1, wherein the one or more transfer robots have multiple effectors.

11. The substrate manufacturing, processing, transfer or storage system according to claim 1 wherein each of the one or more transfer robots includes:
    at least one substrate effector to unload or move at least one substrate or stack, and
    at least one carrier effector to unload or move at least one carrier or carrier stack with or without the substrate.

12. The substrate manufacturing, processing, transfer or storage system according to claim 1, wherein
    the plurality of stations includes a sorting station; and a robot takes carriers and substrates from one stack or multiple stacks and reorganizes them, stacks them, or otherwise sorts them.

13. The substrate manufacturing, processing, transfer or storage system according to claim 12 wherein the robot is able to sort stack to stack, sub stack to sub stack, individually, or any combination or permeation.

14. The substrate manufacturing, processing, transfer or storage system according to claim 1 wherein the opener station is able to access carrier and substrate stacks in the storage or stocker station through at least one robot, such that the opener station is able to accept and opens the stack.

15. The substrate manufacturing, processing, transfer or storage system according to claim 14, wherein
the same or another robot is able to access and remove one or more carriers and substrates in the opener station; and
the opener station closes the stack into high density configuration to be returned to the storage or stocking station.

* * * * *